United States Patent
Wu et al.

(10) Patent No.: US 6,689,211 B1
(45) Date of Patent: *Feb. 10, 2004

(54) ETCH STOP LAYER SYSTEM

(75) Inventors: Kenneth C. Wu, San Francisco, CA (US); Eugene A. Fitzgerald, Windham, NH (US); Jeffrey T. Borenstein, Hollison, MA (US); Gianna Taraschi, Andover, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/599,260

(22) Filed: Jun. 22, 2000

Related U.S. Application Data

(63) Continuation-in-part of application No. 09/289,514, filed on Apr. 9, 1999.
(60) Provisional application No. 60/081,301, filed on Apr. 10, 1999.

(51) Int. Cl.[7] ............................................. C30B 25/22
(52) U.S. Cl. ........................... 117/94; 117/95; 117/97; 117/915; 117/939
(58) Field of Search ........................... 117/94, 95, 97, 117/915, 939

(56) References Cited

U.S. PATENT DOCUMENTS

| | | | |
|---|---|---|---|
| 5,013,681 A | 5/1991 | Godbey et al. | |
| 5,413,679 A | 5/1995 | Godbey | |
| 5,906,951 A | 5/1999 | Chu et al. | 438/751 |
| 6,059,895 A | 5/2000 | Chu et al. | |

FOREIGN PATENT DOCUMENTS

| | | |
|---|---|---|
| EP | 0 828 296 | 3/1998 |
| WO | WO 99/53539 | 10/1999 |

OTHER PUBLICATIONS

"Selective Etching of SiGe/Si Heterostructures," Chang et al. *Journal of the Electrochemical Society.* Jan. 1991, No. 1.

(List continued on next page.)

*Primary Examiner*—Robert Kunemund
(74) *Attorney, Agent, or Firm*—Testa, Hurwitz & Thibeault, LLP

(57) ABSTRACT

A SiGe monocrystalline etch-stop material system on a monocrystalline silicon substrate. The etch-stop material system can vary in exact composition, but is a doped or undoped $Si_{1-x}Ge_x$ alloy with x generally between 0.2 and 0.5. Across its thickness, the etch-stop material itself is uniform in composition. The etch stop is used for micromachining by aqueous anisotropic etchants of silicon such as potassium hydroxide, sodium hydroxide, lithium hydroxide, ethylenediamine/pyrocatechol/pyrazine (EDP), TMAH, and hydrazine. These solutions generally etch any silicon containing less than $7 \times 10^{19}$ $cm^{-3}$ of boron or undoped $Si_{1-x}Ge_x$ alloys with x less than approximately 18. Alloying silicon with moderate concentrations of germanium leads to excellent etch selectivities, i.e., differences in etch rate versus pure undoped silicon. This is attributed to the change in energy band structure by the addition of germanium. Furthermore, the nondegenerate doping in the $Si_{1-x}Ge_x$ alloy should not affect the etch-stop behavior. The etch-stop of the invention includes the use of a graded-composition buffer between the silicon substrate and the SiGe etch-stop material. Nominally, the buffer has a linearly-changing composition with respect to thickness, from pure silicon at the substrate/buffer interface to a composition of germanium, and dopant if also present, at the buffer/etch-stop interface which can still be etched at an appreciable rate. Here, there is a strategic jump in germanium and concentration from the buffer side of the interface to the etch-stop material, such that the etch-stop layer is considerably more resistant to the etchant. This process and layer structure allows for an entire range of new materials for microelectronics. The etch-stop capabilities introduce new novel processes and structures such as relaxed SiGe alloys on Si, $SiO_2$, and $SiO_2$/Si. Such materials are useful for future strained Si MOSFET devices and circuits.

111 Claims, 15 Drawing Sheets

OTHER PUBLICATIONS

"Silicon–On–Insulator by Wafer Bonding: A Review," W.P. Mazara. *Journal of the Electrochemical Society*. Jan. 1991, No. 1.

"Si/SiGe High–Speed Field–Effect Transistors," K. Ismail. *Electron Devices Meeting*, Washington, D.C. Dec. 10, 1995.

Borenstein, J.T., N.D. Gerrish, M.T. Currie and E.A. Fitzgerald, "A New Ultra–Hard Etch–Stop Layer for High Precision Micromachining", *Proceedings of the 1999 12th IEEE International Conference on Micro Electro Mechanical Systems (MEMs)*, Jan. 17–21, 1999, pp. 205–210.

Feijoo, D., J.C. Bean, L.J. Peticolas, L.C. Feldman and W.C. Liang, "Epitaxial Si–Ge Etch Stop Layers with Ethylene Diamine Pyrocatechol for Bonded and Etchback Silicon–on–Insulator", *Journal of Electronic Materials*, vol. 23, No. 6, Jun. 1994, pp. 493–496.

Fitzgerald, E.A., Y.H. Xie, M.L. Green, D. Brasen, A.R. Kortan, J. Michel, Y.J. Mii and B.E. Weir, "Totally Relaxed $Ge_xSi_{1-x}$ Layeres with Low Threading Dislocation Densities Grown on Si Substrates", *Applied Physics Letters*, vol. 59, No. 7, Aug. 12, 1991, pp. 811–813.

Finne et al., "A Water–Amine–Complexing Agent System for Etching Silicon," *J. Electrochem. Soc.*, vol. 114, No. 9 (Sep. 1967) pp. 965–970.

Narozny et al., "Si/SiGe Heterojunction Bipolar Transistor with Graded GAP SiGe Base Made by Molecular Beam Epitaxy," *IEEE IEDM* (1988) pp. 562–565.

Seidel et al., "Anisotropic Etching of Crystalline Silicon in Alkaline Solutions," *J. Electrochem. Soc.*, vol. 137, No. 11 (Nov. 1990) pp. 3626–3632.

Shang et al., "The Development of an Anisotropic Si Etch Process Selective to $Ge_xSi_{1-x}$ Underlayers," *J. Electrochem. Soc.*, vol. 141, No. 2 (Feb. 1994) pp. 507–510.

Chen et al., "The Band Model and the Etching Mechanism of Silicon in Aqueous KOH," *J. Electrochem. Soc.*, vol. 142, No. 1 (Jan. 1995) pp. 170–176.

Leancu et al., "Anisotropic etching of germanium," *Sensors and Actuators A*, vol. 46–47 (1995) pp. 35–37.

Yi et al., "$Si_{1-x}Ge_x$/Si Multiple Quantum Well Wires Fabricated Using Selective Etching," *Mat. Res. Soc. Symp. Proc.*, vol. 379 (1995) pp. 91–96.

Godbey et al., "A $Si_{0.7}Ge_{0.3}$ strained–layer etch stop for the generation of thin layer undoped silicon," *Appl. Phys. Lett.*, vol. 56 No. 4 (Jan. 22, 1990) pp. 373–375.

ETCH STOP LAYER SYSTEM

PRIORITY INFORMATION

This application is a continuation-in-part application of Ser. No. 09/289,514 filed Apr. 9, 1999, which claims priority from provisional application Ser. No. 60/081,301 filed Apr. 10, 1998.

BACKGROUND OF THE INVENTION

The invention relates to the field of etch-stop material systems on monocrystalline silicon.

Microelectromechanical systems (MEMS) form the bridge between conventional microelectronics and the physical world. They serve the entire spectrum of possible applications. MEMS include such varied devices as sensors, actuators, chemical reactors, drug delivery systems, turbines, and display technologies. At the heart of any MEMS is a physical structure (a membrane, cantilever beam, bridge, arm, channel, or grating) that is "micromachined" from silicon or some other electronic material. Since MEMS are of about the same size scale and, ideally, fully integrated with associated microelectronics, naturally they should capitalize on the same materials, processes, equipment, and technologies as those of the microelectronics industry. Because the process technology for silicon is already extensively developed for VLSI electronics, silicon is the dominant material for micromachining. Silicon is also mechanically superior to compound semiconductor materials and, by far, no other electronic material has been as thoroughly studied.

A wide array of micromachined silicon devices are fabricated using a high boron concentration "etch-stop" layer in combination with anisotropic wet etchants such as ethylenediamine and pyrocatechol aqueous solution (EDP), potassium hydroxide aqueous solution (KOH), or hydrazine ($N_2H_2$). Etch selectivity is defined as the preferential etching of one material faster than another and quantified as the ratio of the faster rate to the slower rate. Selectivity is realized for boron levels above $10^{19}$ cm$^{-3}$, and improves as boron content increases.

It should be noted that etch stops are also used in bond and etch-back silicon on insulator (BESOI) processing for SOI microelectronics. The etch-stop requirements differ somewhat from those of micromachining, e.g., physical dimensions and defects, but the fundamentals are the same. Hence, learning and development in one area of application can and should be leveraged in the other. In particular, advances in relaxed SiGe alloys as substrates for high speed electronics suggests that a bond-and-etch scheme for creating SiGe-on-insulator would be a desirable process for creating high speed and wireless communications systems.

SUMMARY OF THE INVENTION

Accordingly, the invention provides a SiGe monocrystalline etch-stop material system on a monocrystalline silicon substrate. The etch-stop material system can vary in exact composition, but is a doped or undoped $Si_{1-x}Ge_x$ alloy with x generally between 0.2 and 0.5. Across its thickness, the etch-stop material itself is uniform in composition. The etch stop is used for micromachining by aqueous anisotropic etchants of silicon such as potassium hydroxide, sodium hydroxide, lithium hydroxide, ethylenediamine/pyrocatechol/pyrazine (EDP), TMAH, and hydrazine. For example, a cantilever can be made of this etch-stop material system, then released from its substrate and surrounding material, i.e., "micromachined", by exposure to one of these etchants. These solutions generally etch any silicon containing less than $7 \times 10^{19}$ cm$^{-3}$ of boron or undoped $Si_{1-x}Ge_x$ alloys with x less than approximately 18.

Alloying silicon with moderate concentrations of germanium leads to excellent etch selectivities, i.e., differences in etch rate versus pure undoped silicon. This is attributed to the change in energy band structure by the addition of germanium. Furthermore, the nondegenerate doping in the $Si_{1-x}Ge_x$ alloy should not affect the etch-stop behavior.

The etch-stop of the invention includes the use of a graded-composition buffer between the silicon substrate and the SiGe etch-stop material. Nominally, the buffer has a linearly-changing composition with respect to thickness, from pure silicon at the substrate/buffer interface to a composition of germanium, and dopant if also present, at the buffer/etch-stop interface which can still be etched at an appreciable rate. Here, there is a strategic jump in germanium and concentration from the buffer side of the interface to the etch-stop material, such that the etch-stop layer is considerably more resistant to the etchant.

In accordance with the invention there is provided a monocrystalline etch-stop layer system for use on a monocrystalline Si substrate. In one embodiment of the invention, the system includes a substantially relaxed graded layer of $Si_{1-x}Ge_x$, and a uniform etch-stop layer of substantially relaxed $Si_{1-y}Ge_y$. In another embodiment of the invention, the system includes a substantially relaxed graded layer of $Si_{1-x}Ge_x$, a uniform etch-stop layer of substantially relaxed $Si_{1-y}Ge_y$, and a strained $Si_{1-z}Ge_z$ layer. In yet another embodiment of the invention, the system includes a substantially relaxed graded layer of $Si_{1-x}Ge_x$, a uniform etch-stop layer of substantially relaxed $Si_{1-y}Ge_y$, a second etch-stop layer of strained $Si_{1-z}Ge_z$, and a substantially relaxed $Si_{1-w}Ge_w$ layer.

In accordance with the invention there is also provided a method of integrating device or layer. The method includes depositing a substantially relaxed graded layer of $Si_{1-x}Ge_x$ on a Si substrate; depositing a uniform etch-stop layer of substantially relaxed $Si_{1-y}Ge_y$ on the graded buffer; and etching portions of the substrate and the graded buffer in order to release the etch-stop layer.

In accordance with another embodiment of the invention, there is provided a method of integrating a device or layer. The method includes depositing a substantially relaxed graded layer of $Si_{1-x}Ge_x$ on a Si substrate; depositing a uniform first etch-stop layer of substantially relaxed $Si_{1-y}Ge_y$ on the graded buffer; depositing a second etch-stop layer of strained $Si_{1-z}Ge_z$; depositing a substantially relaxed $Si_{1-w}Ge_w$ layer; etching portions of the substrate and the graded buffer in order to release the first etch-stop layer; and etching portions of the residual graded buffer in order to release the second etch-stop $Si_{1-z}Ge_z$ layer.

DETAILED DESCRIPTION OF THE INVENTION

Figure 1A:
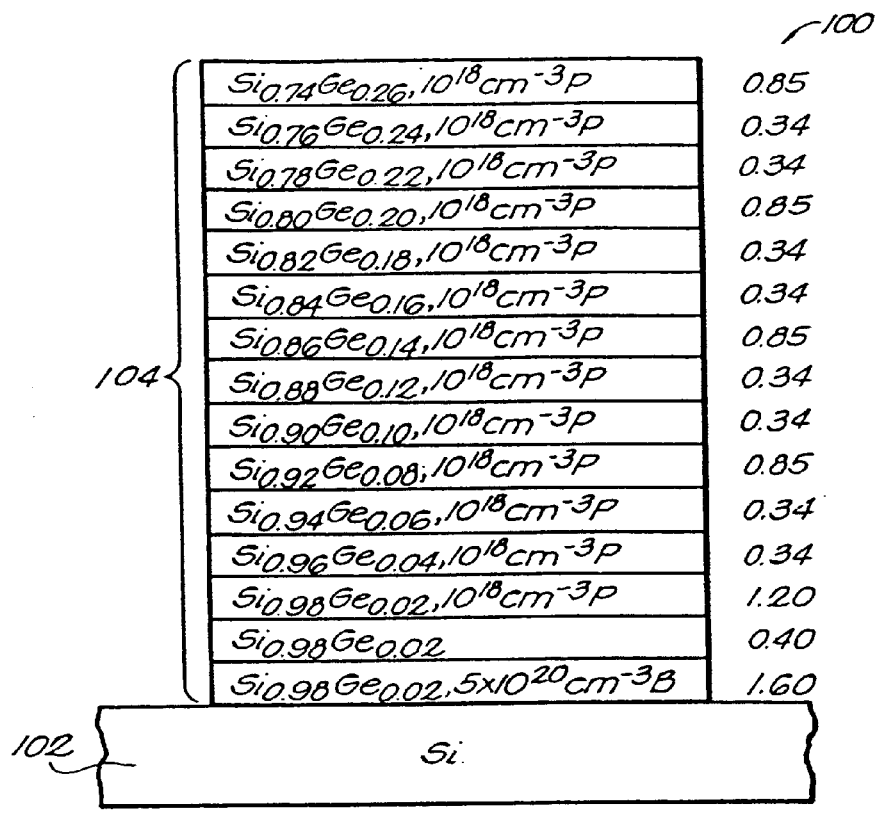
FIGS. 1A–1D are functional block diagrams of exemplary epitaxial SiGe etch stop structures configured on a silicon substrate in accordance with the invention.

In the traditional method of forming etch stops in Si micromachining or in certain SOI processes, good etch-stop results are only obtained at very high concentrations of boron, and the dopant's effect on the silicon crystal structure becomes vitally important. Substitution of a silicon atom site with boron, a smaller atom than silicon, contracts the silicon lattice. As the doped lattice remains coherent with the lattice of the undoped substrate, a biaxial "lattice mismatch" stress is generated in the plane of the substrate. This stress biaxially elongates, i.e., elastically strains, the doped material in the same plane. As the base of a unit cell is strained, so is the height via Poisson distortion. Therefore, the Si:B lattice is vertically contracted as it is horizontally expanded, leading to a smaller vertical lattice constant than the equilibrium value. For thin layers of Si:B, it is energetically favorable for the material to be elastically strained like this, i.e., "pseudomorphic".

As the thickness of the doped layer grows, however, the total strain energy per unit area of film increases proportionally, until the layer surpasses a "critical thickness" when it is energetically favorable to introduce dislocations instead of elastically straining the film. Dislocation loops are heterogeneously nucleated at the film surface or film edges and grow larger, gliding towards the substrate-film interface. When a loop meets the interface, the two ends (now called "threading" dislocations because they traverse the thickness of the film) continue to travel away from each other, trailing a line defect at the interface known as a "misfit" dislocation. The misfit dislocations accommodate the lattice-mismatch stress, relieving the horizontal and vertical strains and restoring the in-plane and perpendicular lattice constants to the equilibrium value, i.e., "relaxing" the material. For a low-mismatched lightly strained epitaxial film on a diamond cubic or zincblende substrate, a mesh of orthogonal <110> misfit dislocations is the most likely configuration because of the {111}<110> easy slip system for these crystal structures at elevated temperatures, such as those involved in diffusion and most CVD processes.

At high enough quantities, the effects of any dissimilar-sized substitutional atom on the silicon microstructure are the same as those of boron. Of course, the impact depends on the relative size and concentration of the substitutional species. Also, incorporation of a larger atom than silicon, e.g., germanium, would result in compressive stress and strain rather than a tensile situation like Si:B.

In the conventional etch stop process, extremely high concentrations of boron are needed to achieve a high etch rate selectivity. These very high boron concentrations lead to dislocation introduction in the thick films that are desired in many MEMS applications. Since the p++ process is created usually through a diffusion process, there is a gradient in dislocation density and a gradient in the boron concentration. Because the etch stops in the boron concentration gradient, the thin film part typically possesses large curvature, which is compensated for by an annealing treatment. In addition, the etch stop selectivity is extremely sensitive to the boron concentration. If the concentration falls below the critical $7 \times 10^{19}$ cm$^{-3}$, the selectivity is drastically different. Thus, since this boron concentration is near the solubility limit, dopant concentration fluctuations in the vertical and lateral dimensions produce low yields in MEMS processes. The SiGe etch stop breaks the link between dopant concentration and etch selectivity. Also, since the SiGe alloy is a miscible alloy system, there is continuous complete solubility between Si and Ge.

The theory of anisotropic etching of silicon as described by Seidel et al., J. Electrochem. Soc. 137, pp. 3626–31 (1990), incorporated herein by reference, is widely considered the appropriate model. Although specifics like absolute etch rate and dissolution products may differ, the general concept is valid for all anisotropic etchants, as they are all aqueous alkaline solutions and the contribution of the etchant is modeled as nothing more specific than H$_2$O and OH—. Indeed, the existing literature shows consistent behavior among the etchants.

Early work on etch rate reduction in p++ Si:B presented no hypotheses beyond empirical data. Two possible explanations for the etch-stop phenomenon were proposed: stronger bonding from the high boron concentration or the formation of a boron-based passivation layer. As research accumulated, the etch-stop theories aligned along two credible approaches. The electronic models assign etch-stop behavior to the action of carriers while the passivation models directly attribute it to the formation of a passivating oxide-based layer on the silicon surface.

Others concluded that the etch-rate decrease is sensitive to hole concentration and not to atomic concentration of boron or stress. They observed an etch rate drop that was proportional to the fourth power of the increase in boron concentration beyond about $3 \times 10^{19}$ cm$^{-3}$. Four electrons are required by a red-ox etching process they described, leading them to explain the etch-stop effect in p++ material as an increased probability that the electrons are lost to Auger recombination because of the higher hole concentrations.

Seidel et al. agreed with the electron recombination hypothesis. They saw the etch rate begin to fall around $2-3 \times 10^{19}$ cm$^{-3}$, which agrees with the doping level for the onset of degeneracy, $2.2 \times 10^{19}$ cm$^{-3}$. At degeneracy, the Fermi level drops into the valence band and the band-bending is confined to a thickness on the order of one atomic layer. The injected electrons needed for etching are able to tunnel through such a narrow potential well and recombine in the p++ bulk crystal, which halts the etching reaction. The remnant etch rate in the etch-stop regime is attributed to the conduction band electrons, whose quantity is inversely proportional to the hole, i.e. boron, concentration. Four electrons are required to etch one silicon atom, which explains the dependence of the remnant etch rate on the fourth power of the boron concentration.

It was observed that the formation of an SiO$_x$ passivation layer on p++ Si:B($2 \times 10^{20}$ cm$^{-3}$) in aqueous KOH by in situ ellipsometric measurements. In the case of p$^+$ –Si, a large number of holes at the surface causes spontaneous passivation with a thin oxide-like layer. The layer is not completely networked like thermal oxide, so it is etched faster and there is still transport of reactants and etch products across the layer, leading to some finite overall etch rate. The lattice strain induced by a high dopant concentration could enhance the layer's growth. Furthermore, the etch rate reduction is not a Fermi-level effect since the phenomenon is exhibited by both heavily doped p- and n-silicon.

Chen et al., J. Electrochem. Soc. 142, p.172 (1995), assimilated the observations and hypotheses above and; their own findings into a composite electrochemical model, where etch stopping is attributed to the enhancement of the oxide film growth rate under high carrier concentration. The key process is hole-driven oxidation at the interface, which inhibits etching by competing with a reaction for Si—Si bonds and hydroxyl radicals, but more importantly, by building the SiO$_x$ barrier. In p++ silicon, a sufficient quantity of holes for etch-stop behavior is supplied as the converse of the electron action outlined by Seidel et al. That is, instead of electrons thermally escaping the potential well or tunneling through into the bulk crystal, holes from the bulk crystal thermally overcome or tunnel through the potential barrier to the interface. It will be appreciated that this etch-stop process is dynamic, i.e., it is a continuous competition of silicon dissolution and formation/dissolution of the oxide-like layer, whose net result is a nonzero etch rate.

Germanium is appealing as an etch-resistant additive because it is isoelectronic to, and perfectly miscible in, silicon and diffuses much less readily than dopants and impurities in silicon. Furthermore, the epitaxy of silicon-germanium alloys is selective with respect to silicon oxide, facilitating patterning and structuring, and even affords higher carrier mobilities to electronics monolithically integrated with MEMS.

Existing germanium-based etch-stop systems are, at best, only marginally suitable for silicon micromachining. In spite of the aforementioned advantages to using germanium, currently there is an inadequate understanding of the etch-stop effect in silicon-germanium materials and no information on anisotropic etching of high germanium content solid solutions.

Many isotropic etchants for pure germanium exist. Common to all of these is an oxidizer, such as HNO$_3$ or H$_2$O$_2$, and a complexing agent to remove the oxide, like HF or H$_3$PO$_4$. Early studies were made on isotropic germanium etching by solutions such as "Superoxol", a commercially available H$_2$O$_2$-HF recipe. More recently, investigations have been made on various combinations of HNO$_3$, HNO$_2$, HF, H$_2$SO$_4$, H$_2$SO$_2$, CH$_3$COOH, H$_2$O$_2$, and H$_2$O.

In fact, some of these compositions selectively etch germanium or silicon-germanium alloys over silicon, because of differences in the relative oxidation or oxide dissolution rates, but only one etchant exhibits the inverse preference relevant to this project: 100% NH$_4$OH at 75° C. directly attacks polysilicon at 2.5 µm/hr but polygermanium at only 660 Å/hr. Unfortunately, the selectivity is only about 37, the etch rate for silicon is impracticably slow, and the etch is isotropic, which limits its usefulness in micromachining.

Previous results with heavy concentrations of germanium in silicon are likewise discouraging with respect to silicon micromachining. Shang et al., J. Electrochem. Soc. 141, p. 507 (1994), incorporated herein by reference, obtained a selectivity of 6 for relaxed, dislocated Si$_{0.7}$Ge$_{0.3}$:B ($10^{19}$ cm$^{-3}$) in a KOH-propanol-K$_2$Cr$_2$O$_7$ aqueous solution. Yi et al., Mat. Res. Soc. Symp. Proc. 3779, p. 91 (1995), developed a novel NH$_4$NO$_3$-NH$_4$OH etchant with selectivities better than 1000 at 70° C. for 10% and higher germanium alloys. The mixture does not etch pure germanium, but etches pure silicon at 5.67 µm/hr, a weak pace for micromachining purposes. Both systems are isotropic.

By holding the Si$_{0.7}$Ge$_{0.3}$:B film under the critical thickness, Shang's team improved the selectivity in the same KOH-propanol-K$_2$Cr$_2$O$_7$ solution to about 40. Narozny et al., IEEE IEDM (1988) 563, were the first to use such a "strain-selective" recipe, but only realized a selectivity of 20 (for 30% germanium doped with $10^{18}$ cm$^{-3}$ boron) and a sluggish etch rate of 1.5 µm/hr at room temperature for pure silicon.[26] Although the results of Shang et al. and Narozny et al. might have simply been from the well-established etch-stop ability of boron, Godbey et al., Appl. Phys. Lett. 56, p. 374 (1990), achieved a selectivity of 17 with undoped Si$_{0.7}$Ge$_{0.3}$. None of the articles on strain-selective etchants offer an explanation for the selectivity.

The anemic etch rate is a grave disadvantage because many MEMS structures can be fairly large compared to typical VLSI dimensions. Moreover, MEMS structures subjected to strain-selective etchants would have to be thinner than the critical thickness. However, as a pseudomorphic structure is released and its strain relieved, the selectivity would deteriorate. A sacrificial strained etch-stop layer could be used, imposing additional process steps and design constraints, but would at least provide advantages over current oxide/nitride sacrificial layers: monocrystallinity can continue above the layer and silicon-germanium's growth selectivity with respect to oxide adds design/patterning freedom.

The consensus of the research community has been that low concentrations of germanium have little or no effect on etch stopping in anisotropic etchants like KOH and EDP. Up to 12% germanium, Seidel et al. detected no significant suppression of etch rate. p++ layers strain-compensated with 2% germanium showed no remarkable differences from those without germanium. By implanting germanium, Feijóo et al., J. Electrochem. Soc. 139, pp. 2312–13 (1992), attained a maximum selectivity of 12 to 24 in EDP at 80° C., corresponding to a dose with a peak concentration of about 0.6%.

Finne et al., J. Electrochem. Soc. 114, p.969 (1967), however, observed that Si$_{1-x}$Ge$_x$ solid solutions with x as small as 0.05 did not etch in an ethylenediamine-pyrocatechol-water (EPW) solution. This discrepancy may be attributed to the use of {111} wafers, where accurate measurements are difficult because etching in the <111> direction is very slow. No other information has been reported on germanium-rich alloys in anisotropic media.

Corresponding to the ostensible ineffectiveness of germanium as an etch-stop agent in most publications, there has been little discussion of the source of the limited selectivity that has been detected. Seidel et al. cautioned that their model for heavily-doped boron etch stops is not applicable to germanium because the element is isoelectronic to silicon. They assumed instead that the small reduction of the etch rate is either due to changes in the energy band structure, or else a consequence of the extremely high concentration of lattice defects such as misfit dislocations which could act as recombination centers.

The invention provides a SiGe monocrystalline etch-stop material system on a monocrystalline silicon substrate. The etch-stop material system can vary in exact composition, but is a doped or undoped $Si_{1-x}Ge_x$ alloy with x generally between 0.2 and 0.5. Across its thickness, the etch-stop material itself is uniform in composition. The etch stop is used for micromachining by aqueous anisotropic etchants of silicon such as potassium hydroxide, sodium, hydroxide, lithium hydroxide, ethylenediamine/pyrocatechol/pyrazine (EDP), TMAH, and hydrazine. For example, a cantilever can be made of this etch-stop material system, then released from its substrate and surrounding material, i.e., "micromachined", by exposure to one of these etchants. These solutions generally etch any silicon containing less than $7 \times 10^{19}$ $cm^{-3}$ of boron or undoped $Si_{1-x}Ge_x$ alloys with x less than approximately 18.

Thus, it has been determined that alloying silicon with moderate concentrations of germanium leads to excellent etch selectivities, i.e., differences in etch rate versus pure undoped silicon. This is attributed to the change in energy band structure by the addition of germanium. Furthermore, the nondegenerate doping in the $Si_{1-x}Ge_x$ alloy should not affect the etch-stop behavior.

The etch-stop of the invention includes the use of a graded-composition buffer between the silicon substrate and the SiGe etch-stop material. Nominally, the buffer has a linearly-changing composition with respect to thickness, from pure silicon at the substrate/buffer interface to a composition of germanium, and dopant if also present, at the buffer/etch-stop interface which can still be etched at an appreciable rate. Here, there is a strategic jump in germanium and concentration from the buffer side of the interface to the etch-stop material, such that the etch-stop layer is considerably more resistant to the etchant. For example, the buffer could grade up to $Si_{0.85}Ge_{0.15}$, then jump to a uniform etch-stop layer of $Si_{0.7}Ge_{0.3}$. Nominally, the composition gradient in the buffer is 5–10% Ge/micron, and the jump in Ge concentration is 5–15 relative atomic percent Ge. The buffer and etch-stop materials are deposited epitaxially on a standard silicon substrate, such as by chemical vapor deposition (CVD) or molecular beam epitaxy (MBE). Note in the above example that the germanium concentration leads to etch stop behavior, and therefore doping concentrations in the etch stop can be varied independently, without affecting etch selectivity.

With respect to the effect of crystalline defects on the etch-stop behavior, in accordance with the invention using $Si_{1-x}Ge_x$ alloys, the influence of defects is minimal. The use of a graded buffer suppresses the threading dislocation density (TDD) in the top etch-stop layer, which leads to a uniform, nearly defect-free $Si_{1-x}Ge_x$ etch stop.

The significance of the jump in concentration(s) at the end of the graded region is that the part must be well defined and dimensions well controlled. Thus, a high selectivity should exist between the top etch-stop layer and the end of the graded region for abrupt, predictable etch-stop behavior. A smooth compositional transition from buffer to etch-stop layer would lead to curved edges and greater dimensional variability in the micromachined part, whereas compositional jumps would yield clean, sharp edges and precise dimensions in the released structure. However, if the jump is too large, e.g., greater than ~20–25 atomic % Ge, the corresponding change in lattice constant, i.e., the lattice mismatch, would create defects.

The $Si_{1-x}Ge_x$ etch-stop material system, which can be substituted for heavily boron-diffused layers, broadens the spectrum of available etch-stop materials, including undoped (isoelectronic) materials, thus improving the design flexibility for micromachined structures. For example, standard micromachining processes limit the dimensions of silicon sensor structures to a single uniform thickness. Resonant devices for inertial sensing would benefit considerably from more flexible design in which the resonators are thinner than the seismic mass. The invention provides an enabling technology for such a multi-thickness structure. Such a fundamental advantage makes the novel technology widely applicable to the fabrication of MEMS by silicon micromachining.

A tremendously significant application is the ability to integrate mechanical and electronic devices on the same material. Replacement of the heavily boron-doped etch stop, which is incompatible with integrated circuit (IC) requirements, by isoelectronic and/or moderately-doped etch stops of device quality allows concurrent processing of mechanical devices and associated electronics on the same wafer. Germanium is perfectly miscible in silicon and diffuses much less readily than dopants and impurities. Alloying with germanium also affords higher carrier mobilities to the electronic devices.

Furthermore, epitaxy of $Si_{1-x}Ge_x$ alloys is selective with respective to silicon oxide, which facilitates patterning and structuring. In addition, defects do not seem to affect the etch-stop efficacy of these materials.

In developing the germanium-based etch stops of the invention, standard 3" or 4" phosphorous-doped (2–4 $\Omega \cdot cm$) or boron-doped (7–10.2 $\Omega \cdot cm$) (001) silicon substrates were used. The wafers were cleaned for 10 minutes in a piranha bath (3:1 95% $H_2SO_4$ in water: 30% $H_2O_2$ in water) and 10 seconds in 4.4% HF and DI water. The substrates were then left in the load lock (~$10^{-8}$ Torr) of the vertical UHVCVD reactor overnight. On the following day, the substrates were raised to the lip of the reactor chamber for about two hours to drive off any volatiles, organics, and water. Then the wafers were desorbed of whatever oxide remained by raising them into the 850–900° C. reactor chamber for several minutes. A silicon buffer layer on the order of 1 $\mu m$ was deposited with $SiH_4$ while the reactor was brought to process temperature. Following this preparation procedure each time, the epitaxial structures were grown in the temperature range 750–900° C. using $SiH_4$, $GeH_4$, 1% $B_2H_6$ in $H_2$, and 1% $PH_3$ in $H_2$.

KOH and EDP were used in the etching. KOH is a commonly studied etchant, the simplest and easiest to consider, and relatively easy and safe to use. Although details of absolute etch rate differ, various anisotropic silicon etchants have behaved consistently. Seidel et al.'s well-subscribed theory of anisotropic etching is explicitly etchant-nonspecific. Results, discussions, and conclusions regarding anisotropic etching and etch-stopping of silicon are widely considered to be valid for any anisotropic etchant. Cylindrical etching and patterned oxide masks were both used to determine the efficacy of Ge concentration on etch rate.

To test the utility of the relaxed epitaxial SiGe etch stops, epitaxial structures were fabricated: WU_2, WU_3, WU_4, and UHV_17 as shown in FIGS. 1A–1D. FIG. 1A is a functional block diagram of an epitaxial SiGe etch stop structure 100 (WU_2) configured on a silicon substrate 102. The structure includes a plurality of relaxed graded layers 104 that vary from $Si_{0.98}Ge_{0.02}$, $5\times10^{20}$ cm$^{-3}$ B at the substrate surface, to the top surface layer of $Si_{0.74}Ge_{0.26}$, $10^{18}$ cm$^{-3}$ P. The thickness of each layer are provided in $\mu$m.

Figure 1B:
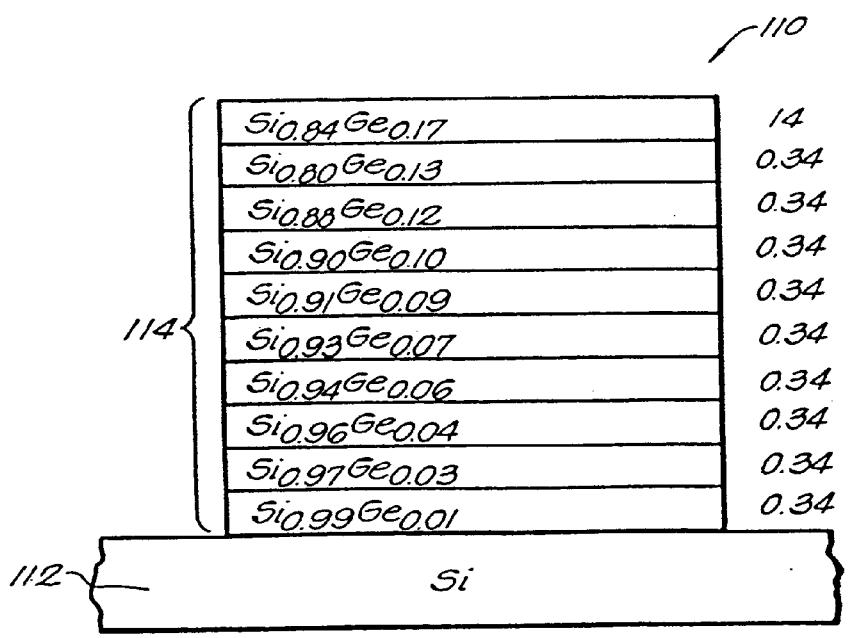

FIG. 1B is a functional block diagram of an epitaxial SiGe etch stop structure 110 (WU_3) configured on a silicon substrate 112. The structure includes a plurality of relaxed graded layers 114 that vary from $Si_{0.99}Ge_{0.01}$ at the substrate surface, to the top surface layer of $Si_{0.84}Ge_{0.16}$.

Figure 1C:
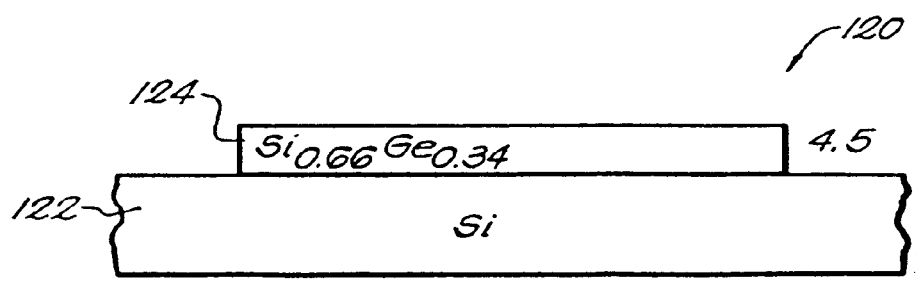

FIG. 1C is a functional block diagram of an epitaxial SiGe etch stop structure 120 (WU_4) configured on a silicon substrate 122. The structure includes a relaxed graded layer 124 of $Si_{0.66}Ge_{0.34}$.

Figure 1D:
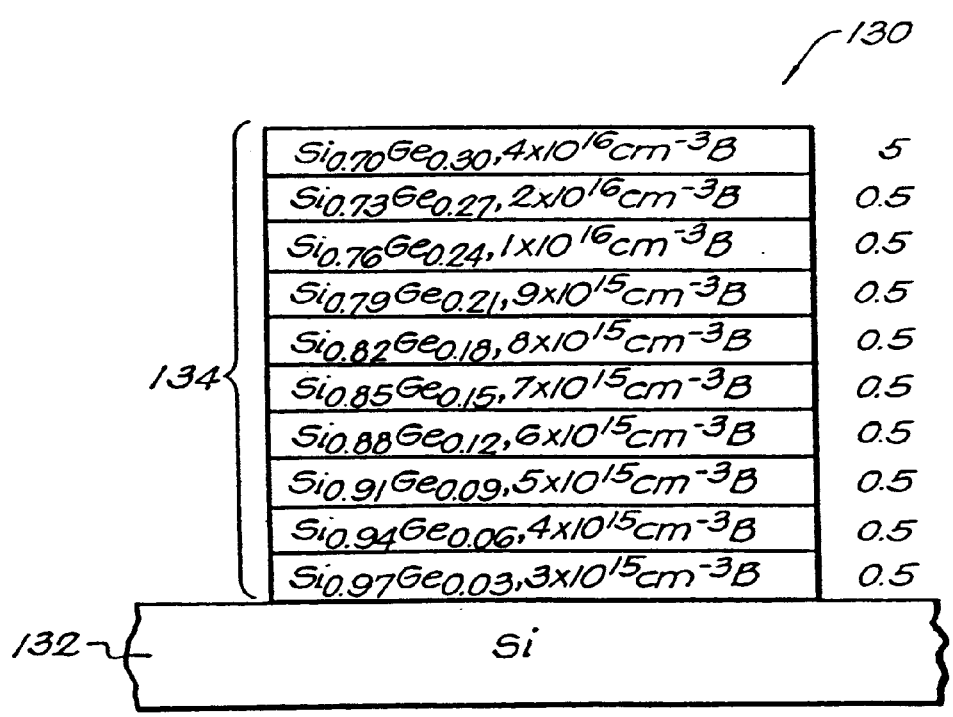

FIG. 1D is a functional block diagram of an epitaxial SiGe etch stop structure 130 (WU_4) configured on a silicon substrate 132. The structure includes a plurality of relaxed graded layers 134 that vary from $Si_{0.97}Ge_{0.03}$, $3\times10^{15}$ cm$^{-3}$ B at the substrate surface, to the top surface layer of $Si_{0.66}Ge_{0.34}$, $4\times10^{16}$ cm$^{-3}$ B.

The compositional grading is known to considerably relax the superficial epitaxial layer while effectively suppressing the TDD. The slow grading rate and generous thickness of these epistructures assure a well-relaxed top film. Thus, the graded buffer enables etching experiments on relaxed, high quality, high germanium content alloys, an etching regime that has never been accessible before. As discussed heretofore, prior research dealt with pseudomorphic $Si_{1-x}Ge_x$ layers or low concentrations of germanium to minimize dislocations, or heavy germanium alloys saturated with threading dislocations. Hence, the grading technique permits one to use the intrinsic etch-stop properties of $Si_{1-x}Ge_x$ solid solutions.

Figure 2:
FIG. 2 is a cross-sectional TEM micrograph of the structure of FIG. 1B.

Based on the approximate volume of a cross-sectional TEM sample, a single threading dislocation in a TEM sample represents a TDD of about $10^8$ cm$^{-2}$. FIG. 2 is a cross-sectional TEM micrograph of structure 110 (WU_3). The top surface is in the upper right direction. The parallel lines (misfit dislocations) define the graded buffer. No threading dislocations can be found, which confirms high crystalline quality. The blurred vertical bands are "bend contours", an artifact of TEM, not threading dislocations.

Figure 3:
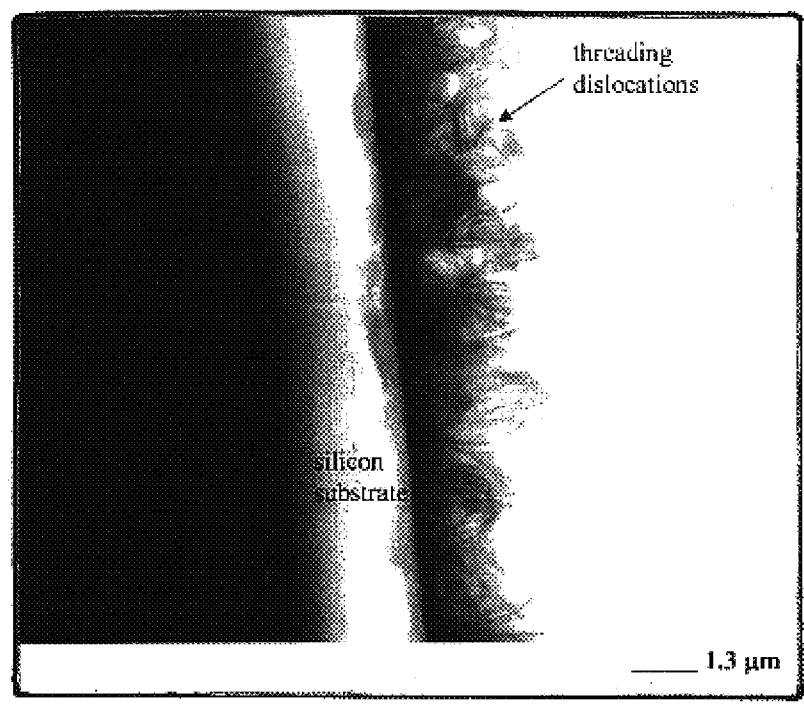
FIG. 3 is a cross-sectional TEM micrograph of the structure of FIG. 1C.

The absence of threading dislocations in FIG. 2 confirms that structures 110 (WU_2), 120 (WU_3), and 130 (UHV_17), which were processed in virtually identical fashion, contain very few defects. TDDs in such relaxed, graded structures have been shown to be in the range of $10^5$–$10^6$ cm$^{-2}$. By omitting the graded buffer, structure 120 (WU_4) was intentionally processed to be significantly imperfect, as verified by FIG. 3. FIG. 3 is a cross-sectional TEM micrograph of structure 120 (WU_4). The top surface is to the right. In contrast to FIG. 2, this film is saturated with threading dislocations, which confirms both poor crystalline quality. The misfit dislocations in all four of these samples are buried under such a thick overlayer that they cannot possibly affect etching from the top surface.

Figure 4:
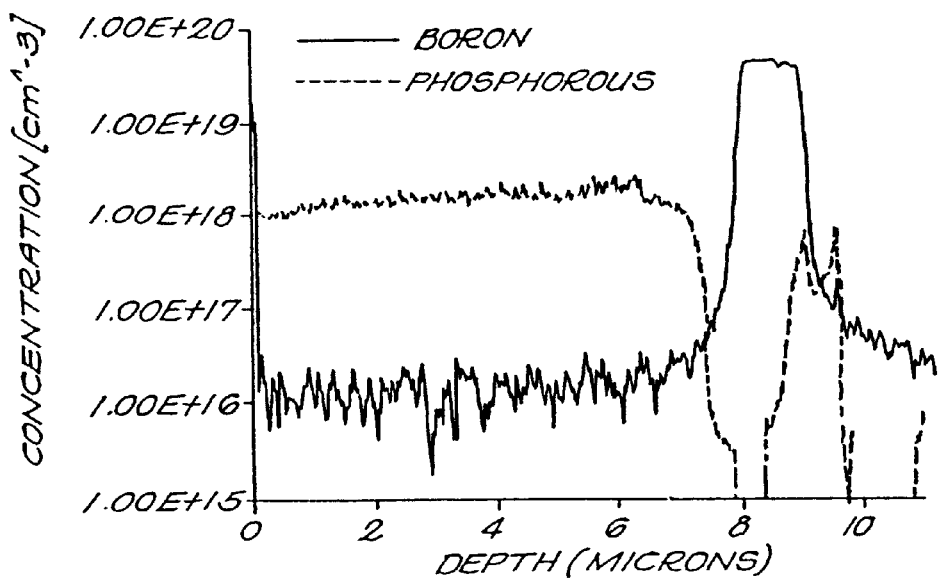
FIG. 4 is graph of dopant concentrations of the structure of FIG. 1A.
Figure 5:
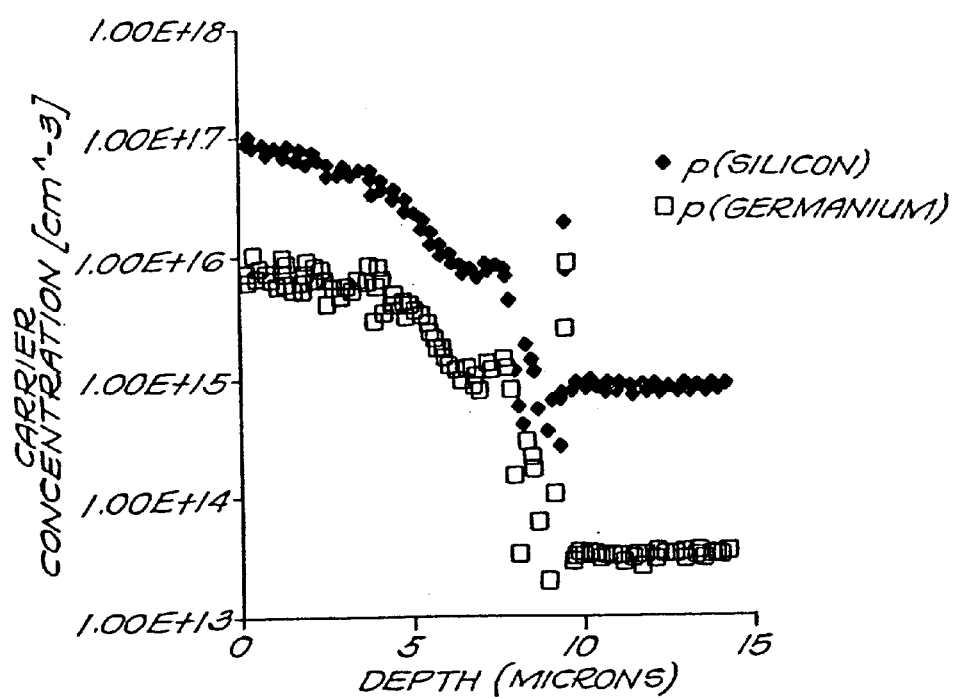
FIG. 5 is a graph of dopant concentrations of the structure of FIG. 1D.

Dopant concentrations of structures 100 (WU_2) and 130 (UHV_17) are shown in the graphs of FIGS. 4 and 5 respectively. The dopant concentrations were calculated from the mobilities of pure silicon and pure germanium, as indicated. Since structure 130 (UHV_17) contains 30% germanium, the true boron content lies somewhere in between, closer to the pure silicon line. Regardless, it is clear that the boron doping does not approach the levels needed for etch stopping. Structure 130 was doped p-type to investigate potential interactions or synergies with germanium that were suppressed in structure 100 by intentional background n-doping.

The characteristics of these materials (top layer) that are relevant to etching are summarized in the following table.

| sample | avg % Ge (EDX) | doping [cm$^{-3}$] | defect density (TEM) |
|---|---|---|---|
| WU_2 | 26 | $10^{18}$P (SIMS) | Low |
| WU_3 | 17 | None | Low |
| WU_4 | 34 | None | High |
| UHV_17 | 30 | $4 \times 10^{16}$ B (SRP) | Low |

Structure 100 (WU_2) was used to identify the critical germanium concentration by cylindrically etching and to obtain etch rate values by etching from the top surface.

Figure 6A:
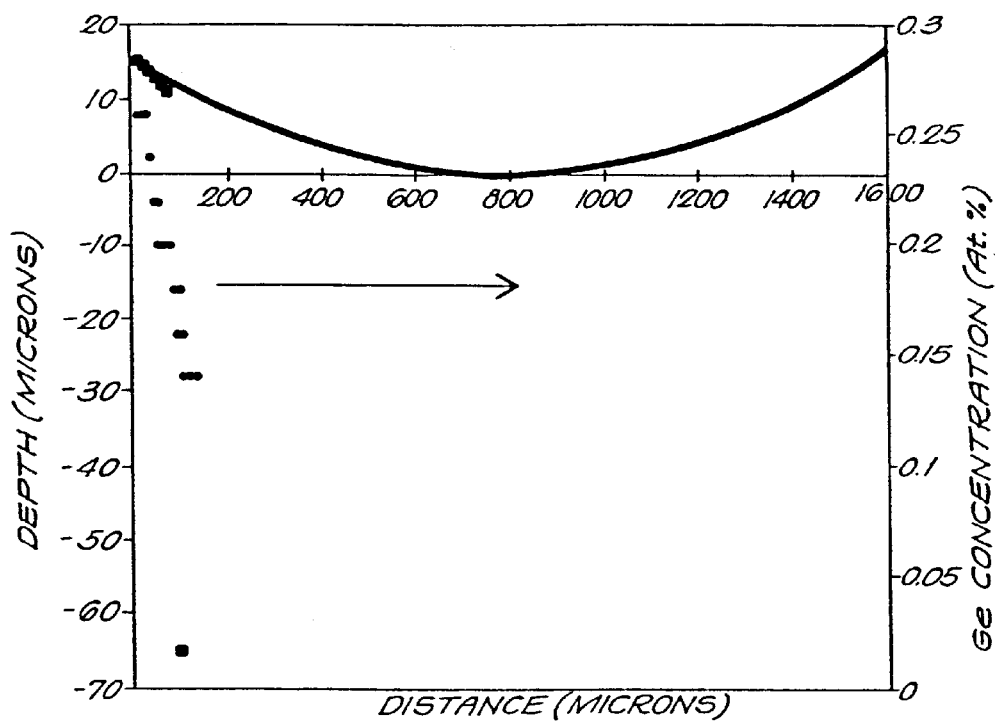
FIG. 6A is a graph showing the cylindrical etch results of the structure of FIG. 1A; FIG.

The cylindrical etch results of structure 100 (WU_2), as shown in the graph of FIG. 6A, confirm the etch-stop behavior of germanium and narrowed the threshold germanium concentration to the range of 16–22%. It was ensured that there were no effects from boron by doping the film n-type. The terraces on the left of the graph, defined by the round dots, represent the layers in the epistructure. The left scale reflects the depth of each layer while the right scale relates the nominal germanium concentration of each layer. The arc is the initial groove surface, and the square dots trace the etched surface.

Figure 6B:
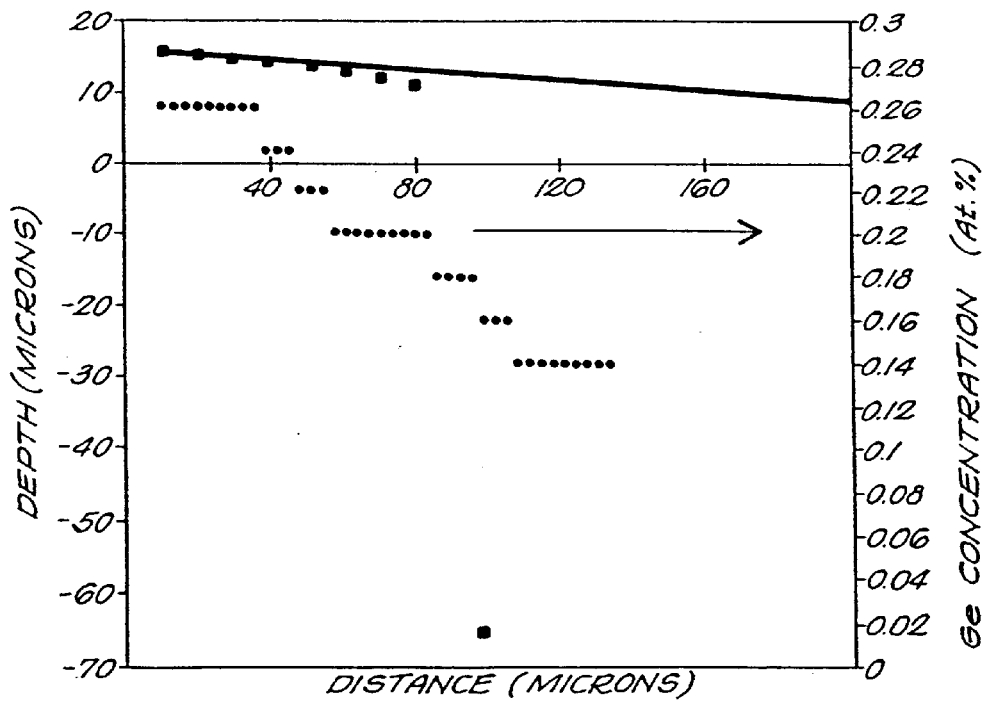
FIG. 6B is graph showing a magnification of the left side of FIG. 6A.

FIG. 6B is a magnification of the left side of FIG. 6A. It is clear that the etch rate increases dramatically somewhere around 18–20% germanium, suggesting that the critical germanium concentration is in that vicinity.

Figure 7:
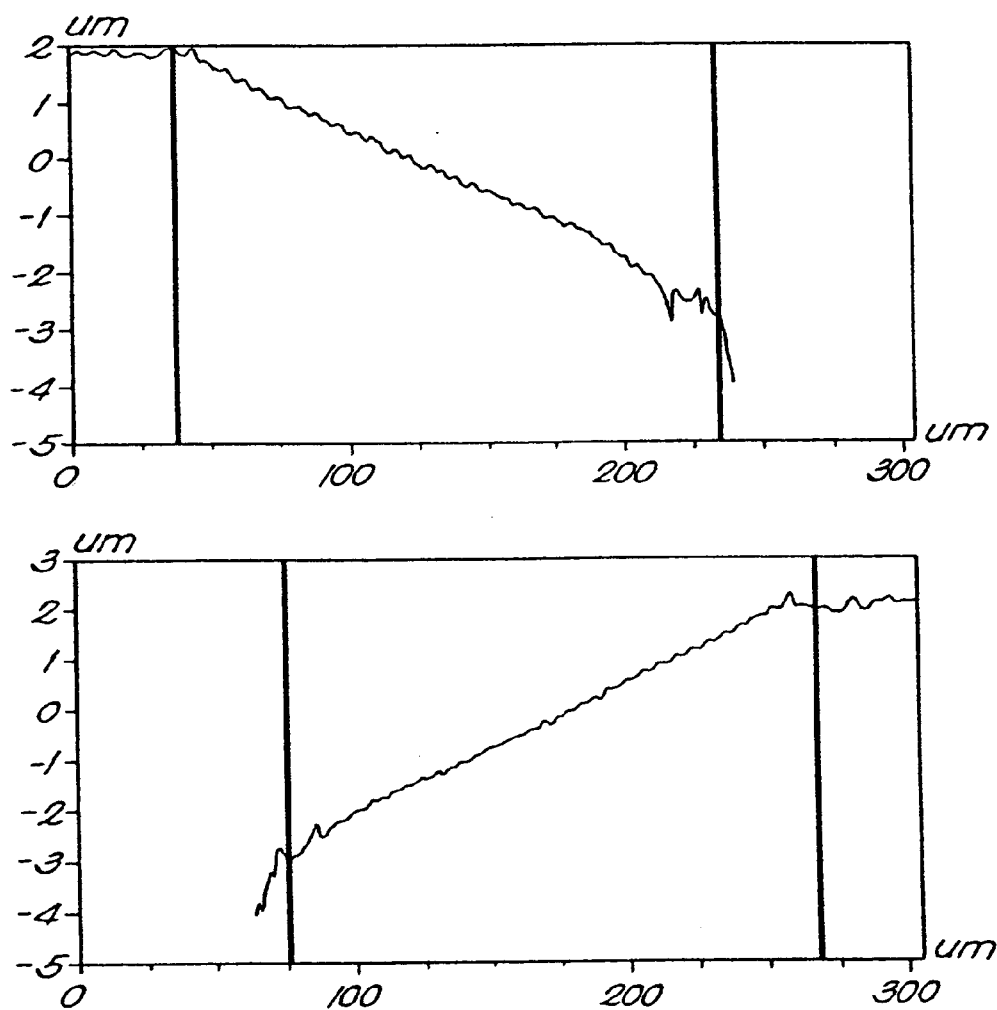
FIG. 7 is a graph showing the cylindrical etch results of the structure of FIG. 1D.

The cylindrical etch results of structure 130 (UHV_17), as shown in the graph of FIG. 7, show the etch accelerating dramatically around 4.8–5 $\mu$m depth. The 5% Ge/$\mu$m grading rate reasonably assures that the threshold germanium concentration is near 20% germanium. The profiles of each side of the groove are shown. The lower bar marks where the profile begins to deviate from the initial grooved shape. The depth of this point appears to be 4.8–5.0 $\mu$m below the top surface.

The results of the etch rate tests using oxide windows are presented in the following table.

| wafer | at % Ge | concentration Ge [cm$^{-3}$] | etch rate [$\mu$m/hr] |
|---|---|---|---|
| WU_2 | 25.6 | $1.28 \times 10^{22}$ | 0.070 |
| WU_3 | 16.9 | $8.45 \times 10^{21}$ | 0.234 |
| WU_4 | 34.0 | $1.70 \times 10^{22}$ | 0.040 |
| UHV_17 | 30.0 | $1.50 \times 10^{22}$ | 0.133 |

The etch rate for <100> intrinsic silicon in 34% KOH at 60° C. was taken as 18.29 $\mu$m/hr from Seidel et al. The experimental data for structures 100 (WU_2), 110 (WU_3), 120 (WU_4), and 130 (UHV_17) are shown in the table. Normalized by 18.29 $\mu$m/hr, they are plotted in the graph of FIG. 8 along with Seidel et al.'s points.

Figure 8:
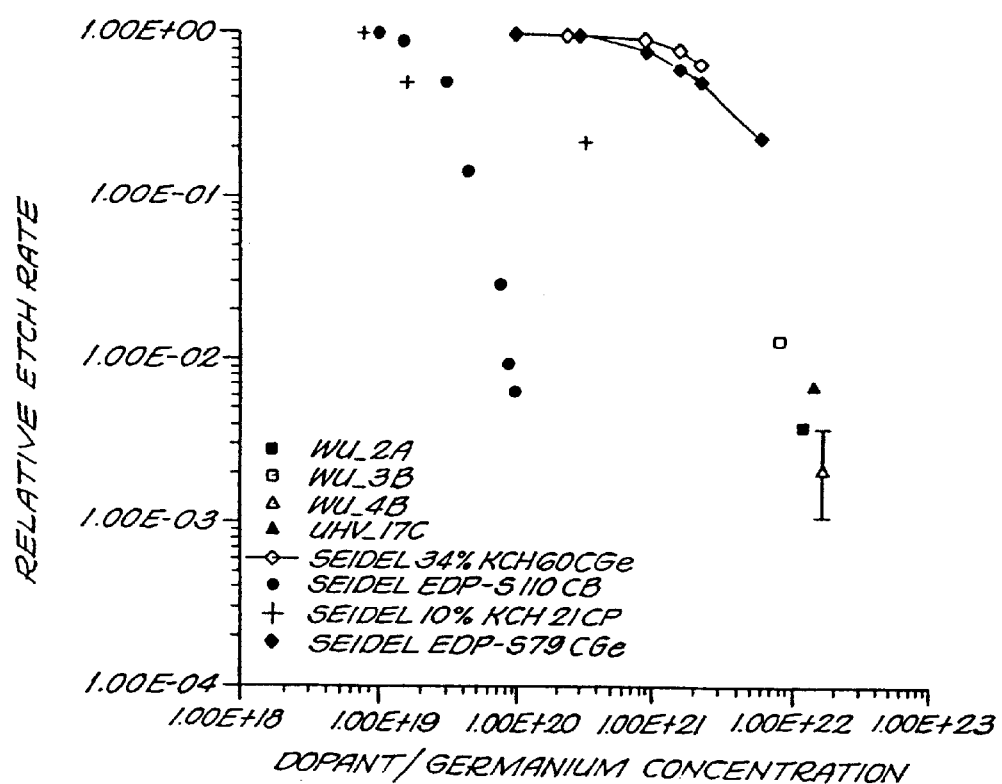
FIG. 8 is a graph showing the etch rates for <100> intrinsic silicon in 34% KOH at 60° C. normalized by 18.29 $\mu$m/hr of the structures of FIGS. 1A–1D.

Some features in FIG. 8 should be emphasized. First, there was appreciably greater variability, both up and down, in the individual etch rates of "good" structure 120 (WU_4) pieces than of the other good samples, hence the error bar. A comparison of all the data supports the belief that the considerable surface roughness of structure 120 (WU_4), from lattice-mismatch stress and the high TDD, is probably to blame. Thus, the graded layer has already proven its efficacy since the graded layer samples did not display this problem.

The shape of the new curve very closely resembles that of EDP-boron curve, adding confidence in the new data as well as implying the existence of a universal etch-stop model. In addition, KOH, a more environmentally friendly etch stop than EDP, appears to be a better etch stop with SiGe alloy than EDP with the conventional p++ etch stop.

Despite the popular sentiment in the literature, it is indisputable that silicon-germanium alloys with sufficient germanium are exceptional etch stops that rival the most heavily boron-doped materials. Three different etching techniques and two etchant systems, KOH and EDP, conclusively show this. The intersection of the steep portion of the KOH-germanium curve with unity relative etch rate, the so-called "critical concentration" as defined by Seidel et al., appears to be $2 \times 10^{21}$ cm$^{-3}$, i.e., 4%, for germanium. Although this value is about 100 times greater than their "critical concentration" for boron, higher selectivities can theoretically be attained with germanium because there are neither solid solubility nor electrical activity limits.

The substantial selectivities obtained from the well-relaxed, low-defect sample structures 100 (WU_2), 110 (WU_3), and 130 (UHV_17) indicate that strain, induced by defects or dissimilar atomic radii, is not principally responsible for etch-stop behavior.

Defects do not play a central role in etch resistance. The excellent results from WU_2, WU_3, and UHV_17, relaxed materials with low TDDs, controvert the speculation that lattice defects serving as recombination centers cause the etch stop behavior with germanium or isoelectronic additives, respectively. Furthermore, a comparison of the etch rate of structure 120 (WU_4) to the KOH- germanium trendline indicates that even a high TDD does not influence etch stopping dramatically (if at all), nor in a predictable fashion.

The immediately attractive explanation for germanium s newfound etch-stop potency in silicon is the mechanism outlined by R. Leancu, Sensors and Actuators, A 46–47 (1995) 35–37, incorporated herein by reference. For 15–30% germanium, it seems more logical to interpolate from the bulk properties of pure germanium than to postulate only how germanium influences the properties of otherwise pure silicon; That is, one should give the germanium atom just as much credit as the silicon atom, since it is no longer a dopant, but rather an alloying species in the truest sense. Thus, the silicon-germanium alloys in question should show a palpable influence from the etching characteristics of pure germanium, which include a slow rate in KOH.

Keeping this simple chemistry approach in mind, a completely miscible binary system like silicon-germanium would display a linear dependence of etch rate versus alloy composition. Even without etch rate data at high germanium concentrations, including pure germanium, FIG. 8 plainly illustrates that such is not the case. Along the same lines, it is unclear why there would be some critical concentration of germanium for an etch-stop effect if the etch rate is simply a consequence of chemical structure, i.e., the proportion of each element. In fact, a nonlinear plot and a critical concentration imply that the etch rate is a function of energy band structure rather than chemical structure.

On a related note, FIG. 8 shows that the germanium-KOH curve is remarkably similar in shape, but not necessarily slope, to the boron-EDP curve, which ascribes its shape to the electronic etch-stop theory. It is difficult to imagine that the germanium-KOH data would just happen to resemble the boron-EDP data, based on a completely different model that warns of no applicability to germanium. That is, it is highly improbable that the true etch-stop mechanism for germanium is entirely unrelated to the true mechanism for boron when the shapes agree so well.

There are reasons to consider an energy band model to account for the etch-stop behavior in silicon-germanium solid solutions. First, the $Si_{1-x}Ge_x$ data resemble the p++ Si:B data, including the critical concentration and power-law dependence of the remnant etch rate, and the p++ Si:B data is explained well by energy band effects. At these quantities, germanium is known to markedly change the band structure of silicon. Furthermore, two possible mechanisms for the etch stop effect of germanium were defects and energy bands. Defect enhanced recombination can be eliminated due to our graded layer approach. Energy band structure is the only other possibility.

Pure bulk germanium has an energy bandgap, $E_g$, of 0.66 eV at room temperature, compared to 1.12 eV for pure bulk silicon. Hence, the addition of germanium to silicon reduces the bandgap: unstrained $Si_{0.7}Ge_{0.3}$, the situation for samples WU_2, WU_3, WU_4, and UHV_7, has an energy gap of approximately 1.04 eV. Germanium also has a smaller electron affinity, $\chi$, than silicon, 4.00 eV versus 4.05 eV. Thus, the incorporation of germanium decreases the electron affinity as well. As germanium is added, the shrinking bandgap and electron affinity reduce the band-bending, the potential well in the conduction band, and the potential barrier in the valence band.

The height of the potential barrier in the valence band, b, is given by:

$$b = (\chi - d) + \frac{1}{2}E_g \quad [1]$$

for a generic intrinsic semiconductor, where d is the distance of the Fermi level from E=0, the reference vacuum level. It is understood that the bandgap of $Si_{1-x}Ge_x$ does not change perfectly linearly with germanium concentration, but it is not known how electron affinity decreases with increasing germanium content. Nevertheless, if the two functions are approximated as linear, then b is also roughly linearly dependent on germanium concentration.

Adding germanium to intrinsic silicon also increases the amount of equilibrium electrons and holes, $n_i$ and $p_i$, respectively, via the decreasing bandgap:

$$n_i = p_i = (N_c N_v)^{\frac{1}{2}} \exp\left(-\frac{E_g}{2kT}\right) \quad [2]$$

where $N_c$ and $N_v$ are the effective density of states in the conduction and valence bands, respectively, k is Boltzmann's constant, and T is temperature. To simplify the description, $N_c$ and $N_v$ will be assumed to be constant and equal to the values for pure silicon. Again, if Eg's dependence on germanium concentration is considered linear, then $p_i$ is exponentially related to germanium concentration.

The increased $p_i$ increases the passivation reaction. For the intrinsic situation, it is assumed that the well/barrier is not sharp enough to allow tunneling. This is especially true for $Si_{1-x}Ge_x$, with the shallower barrier. Furthermore, the inversion layer at the surface is n-type. Then the supply of holes to the passivation reaction is h, the amount of holes from the bulk that overcome the potential barrier thermally. Thus, h is a Boltzmann activated process:

$$h = p_i \exp\left(-\frac{b}{kT}\right) \quad [3]$$

Since $p_i$ is exponentially dependent on germanium content while b is linearly related, h is overall exponentially related to germanium concentration. This can easily be seen by substituting expressions [1] and [2], into [3], yielding:

$$h = (N_c N_v)^{\frac{1}{2}} \exp\left(\frac{-E_g - \chi + d}{kT}\right) \quad [4]$$

where $E_g$ and $\chi$ are linearly dependent on germanium content. If a critical hole concentration exists for interrupting the etch process, then a critical germanium concentration will be observed.

The potential barrier in the valence band increases as the Fermi level moves closer to the valence band, but the hole concentration is significantly increased by p-doping. In fact, the two effects exactly offset each other. In the extrinsic case, the equilibrium hole concentration, p, is defined as:

$$p = n_i \exp\left(\frac{\frac{E_g}{2} - E_F}{kT}\right) \quad [5]$$

$E_g/2 - E_F$ is precisely the change in b when the material is doped. Then, when expression [5] is substituted for $p_i$ in equation [3], $E_g/2 - E_F$ exactly cancels the change in b in expression [3]. Thus, with nondegenerate doping, the value of h never changes from:

$$h = n_i \exp\left(-\frac{b_i}{kT}\right) \quad [6]$$

where $b_i$ is the height of the barrier in the intrinsic material. Thus, a great advantage of the SiGe etch stop is that the etch selectivity depends only on Ge concentration.

Figure 9:
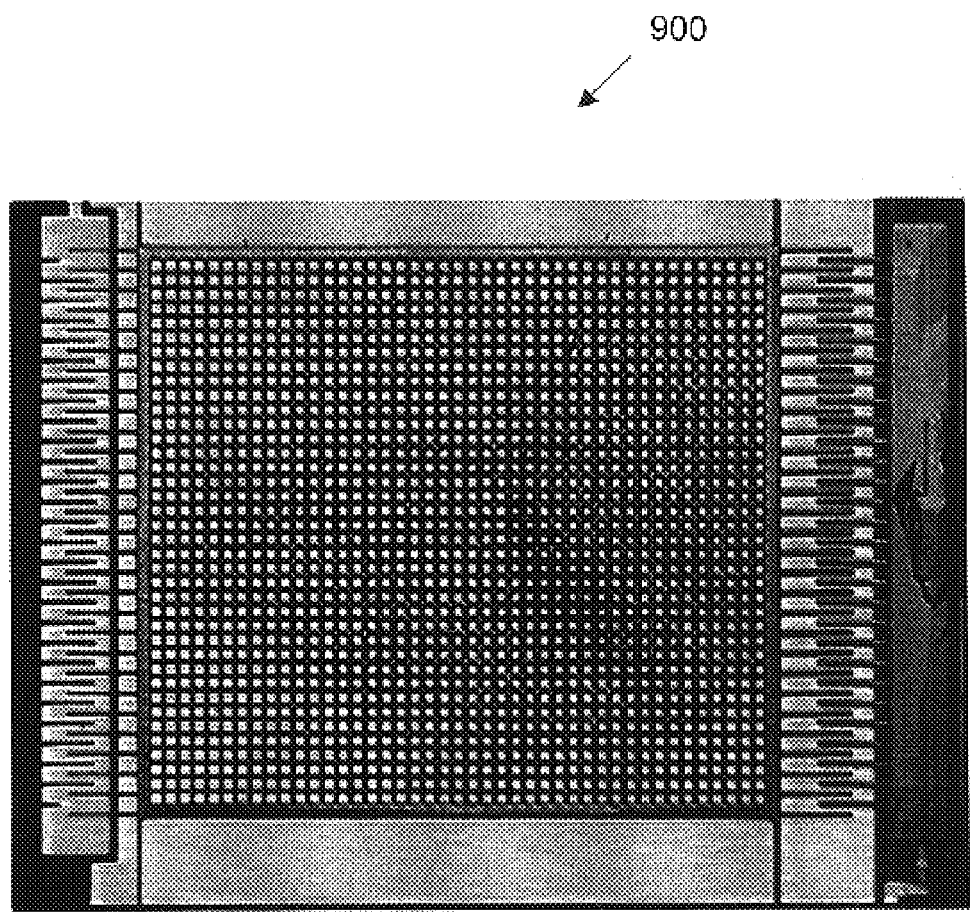
FIG. 9 is a photograph of a top view of a micromachined proof mass.

Test structures of structure 110 (WU_3), completely undoped material, were fabricated and probed. The structure 110 (WU_13) did not provide the 'hardest' etch stop available with SiGe alloys because the germanium concentration (15–17%) was near the concentration when etch stop selectivity starts to decrease. The results were very promising as shown in FIG. 9. FIG. 9 is a photograph of a top view of a micromachined proof mass 900. Even at these low Ge concentrations, etched parts like the proof mass in FIG. 9 are possible. Higher Ge concentrations in the uniform layer (30%) result in extremely hard etch stops, with selectivities approaching 1000:1.

It is apparent from cylindrical and top surface etching with EDP and KOH and actual structures micromachined in EDP that relaxed silicon-germanium alloys with sufficient germanium are exceptional etch stops. Selectivities as high as 1000, corresponding to 34% germanium, have been obtained in KOH for the <100> direction. Neither strain nor defects are responsible for these results. High defect density does not influence the etch rate of $Si_{1-x}Ge_x$ dramatically. A plot of relative etch rate versus germanium concentration follows the same shape as p++ Si:B data, including a critical concentration and a power-law dependence of the remnant rate. The etch stop behavior in relaxed SiGe alloys is correlated to changes in band structure, which are solely connected to Ge concentration.

The extremely high etch selectivities achieved with the SiGe etch stop material system of the invention have immediate applications in forming semiconductor/oxide structures. One method of forming silicon on insulator is to bond a Si wafer to another Si wafer that is coated with silicon dioxide. If one of the wafers is thinned, then a thin layer of Si on silicon dioxide/Si is created. Such structures are useful in low power electronics and high speed electronics since the Si active layer is isolated from a bulk Si substrate via the silicon dioxide layer.

The main disadvantage of this process is the difficulty in thinning one side of the silicon substrate-silicon dioxide-silicon substrate sandwich. In order to have high reproducibility and high yield, the entire wafer must be thinned uniformly. and very accurately. Buried etch stops have been used with little success. Even buried, thin layers of strained SiGe have been used, but as mentioned earlier these etch demonstrate etch selectivities <<100, and therefore are not sufficient.

Figure 10:
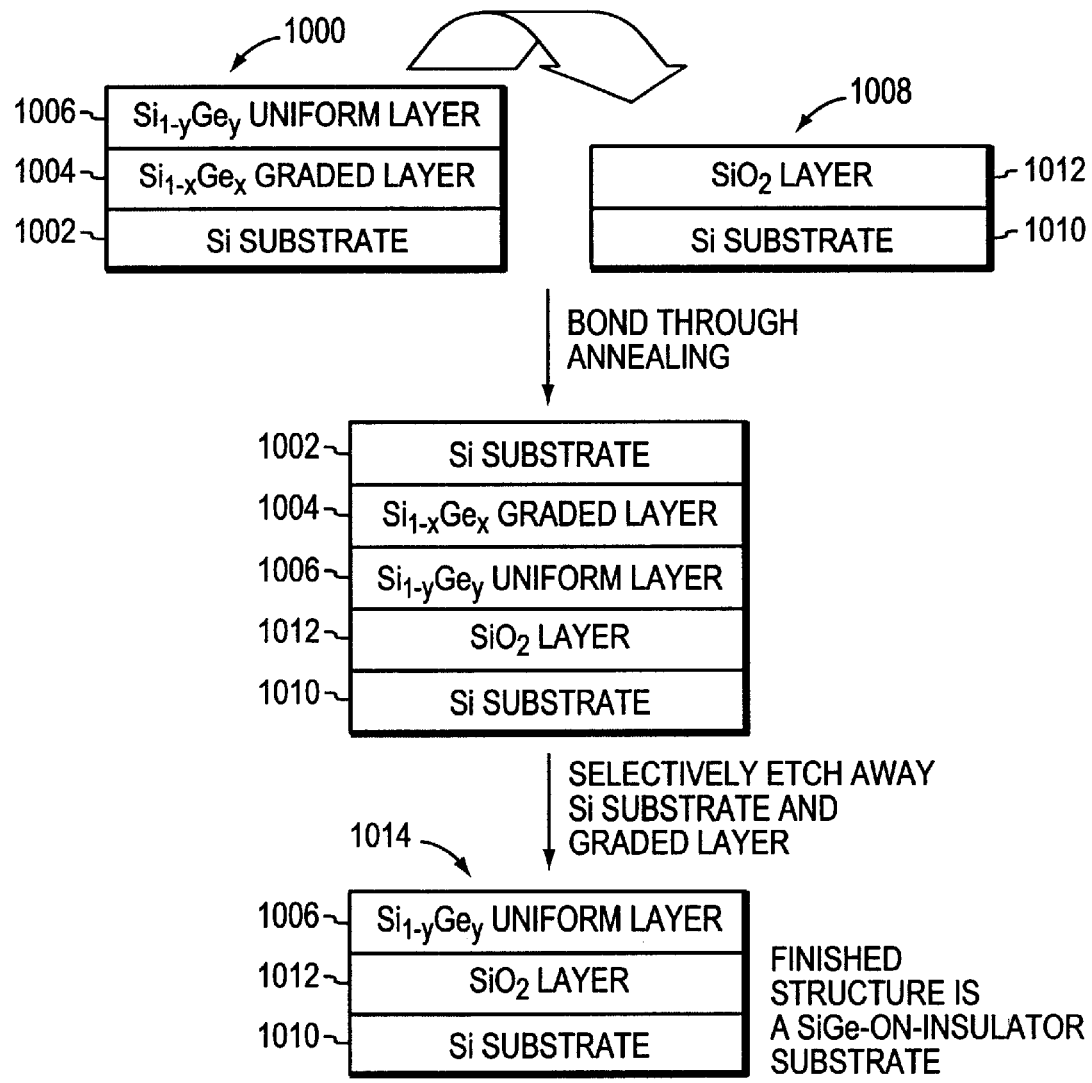
FIG. 10 is a block diagram of a process for fabricating an SiGe-on-insulator structure.
Figures 11A, 11B, 11C:
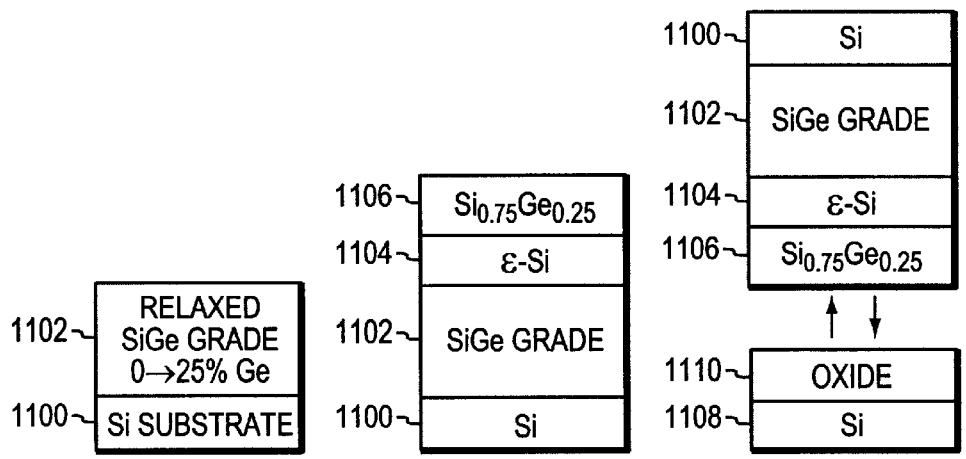
FIGS. 11A–11F are schematic diagrams of the fabrication process for SiGeOI.
Figures 11D, 11E, 11F:
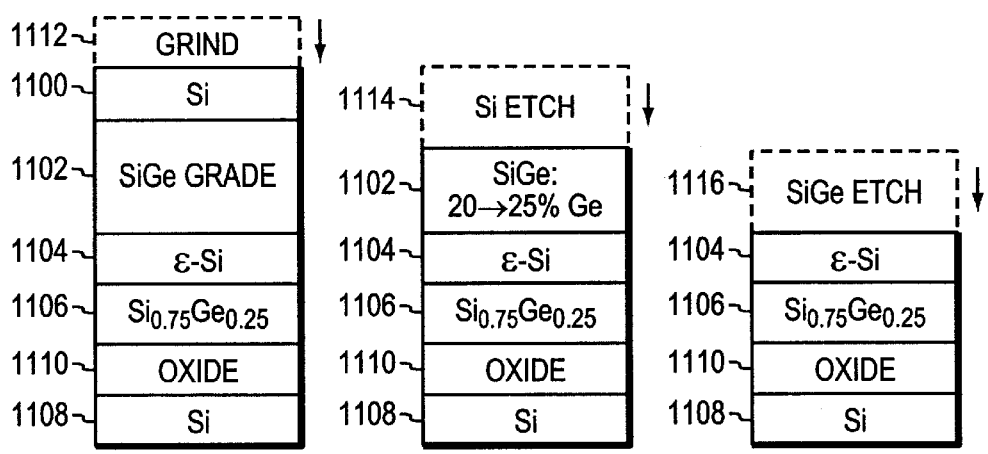

The relaxed SiGe alloys of the invention are ideally suited for this type of etch stop. By bonding a structure 1000. of a graded SiGe layer 1004 and a uniform composition layer 1006 on a silicon wafer 1002 to a structure 1008 having a silicon wafer 1010 coated with silicon dioxide 1012, the etch-stop of the invention can be used to create a very uniform relaxed SiGe alloy on silicon dioxide, which in turn is on a silicon wafer. This process is shown schematically in FIG. 10.

Once the structures are bonded through, for example, annealing, the silicon substrate 1002 and graded layer 1004 are selectively etched away. The finished structure 1014 is a SiGe-on-insulator substrate. It will be appreciated that the structure 1008 can also be a bulk insulating material, such as glass or a glass ceramic.

An entire new materials system from which to make highly effective etch stops has been developed. The new system offers many advantages over current technologies. Germanium is isoelectronic to and perfectly soluble in silicon, and hardly diffuses in it. The deposition of silicon-germanium is selective with respect to oxide. Defects do not weaken the etch-stop efficacy. The etch-stop material can be completely undoped, and according to the proposed band structure model, nondegenerate doping does not influence the etch-stop behavior. This affords incredible utility and design flexibility, especially to integration with microelectronics. To this end, germanium would even afford higher carrier mobilities.

In fact, this etch stop system can easily be used to integrate various strained Si electronics on relaxed SiGe or any desired substrate (eg, insulating or semiconductor substrates), where one such system is SiGe on insulator (SiGeOI). More details of this procedure are provided in the following description.

The main approaches for the fabrication of semiconductors on insulator are separation-by-implanted-oxygen (SIMOX) and wafer bonding (followed by etch-back or Smart-Cut). SIMOX involves implantation by oxygen followed by a high temperature anneal, and hence is attractive due to its apparent simplicity. This technique has shown some success for low Ge compositions, but for higher Ge fractions, in particular for $Si_{0.5}Ge_{0.5}$, the buried oxide structure was not demonstrated, due to the thermodynamic instability of $Si_{1-x}Ge_xO_2$. Simply stated, Ge is not incorporated into the oxide, due to the volatile nature of $GeO_2$, and therefore for high Ge fractions, there are insufficient Si atoms to form a stable oxide. On the other hand, the bonding technique, which involves the bonding of a SiGe wafer to an oxidized handle wafer followed by the removal of excess material, can be applied to any Ge fraction, without the problem of an unstable oxide. In addition, the procedure is general, one can create SiGe on any desired substrate, including any insulating wafer.

The process flow for the bond/etch-back SiGeOI fabrication technique is shown schematically in FIGS. 11A–11F. The process is separated into growth: (a) UHVCVD growth of relaxed SiGe graded buffer followed by CMP, (b) re-growth of strained Si ($\epsilon$-Si) and SiGe bonding layer, and bond/etch-back steps: (c) wafer bonding to insulating substrate, (d) backside grinding, (e) Si etch stopping in the graded layer, (f) SiGe etch stopping on the strained Si.

During the first growth, a relaxed 2.5 $\mu$m compositionally graded SiGe buffer 1102, capped with 2 $\mu$m of $Si_{0.75}Ge_{0.25}$ was deposited onto a Si substrate 1100 at 900° C. using a UHVCVD reactor. The graded buffer minimizes threading dislocations and ensures that misfit are only present in the graded layers and not in the uniform composition cap, but these underlying misfits still generate strain fields which cause the formation of surface cross-hatch during growth. To eliminate this surface roughness, which would hinder wafer bonding, the wafer was polished (using chemical-mechanical polishing, CMP) until the cross-hatch was no longer visible using Nomarsky microscopy.

Next a strained Si structure 1104, consisting of 12 nm of strained Si, followed by a layer 1106 of 150 nm of $Si_{0.75}Ge_{0.25}$, was grown at 650° C. via UHVCVD onto the polished SiGe wafers. The low growth temperature ensures minimal surface exchange and inter-diffusion, and hence guarantees a sharp interface between the Si and SiGe layers. The strained Si layer acts as an etch stop during the final etch step, and depending on the thickness requirement and surface roughness constraint for the strained Si channel, may possibly also be used as a MOSFET device channel.

Figure 12A:
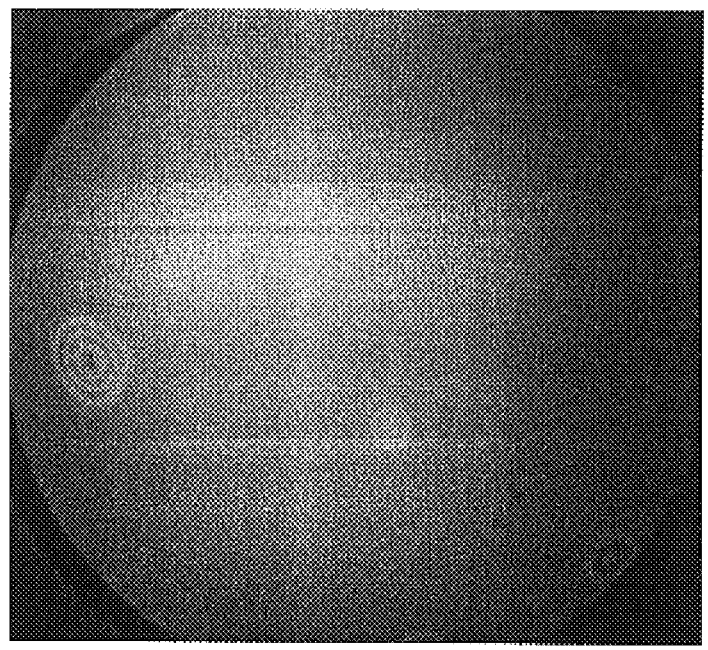
FIGS. 12A and 12B are IR transmission images of intrinsic voids due to particles at the bonding interface, and a demonstration of void-free bonding, and crack due to Maszara surface energy test for SiGe bonded to oxide prior to annealing, respectively.
Figure 12B:
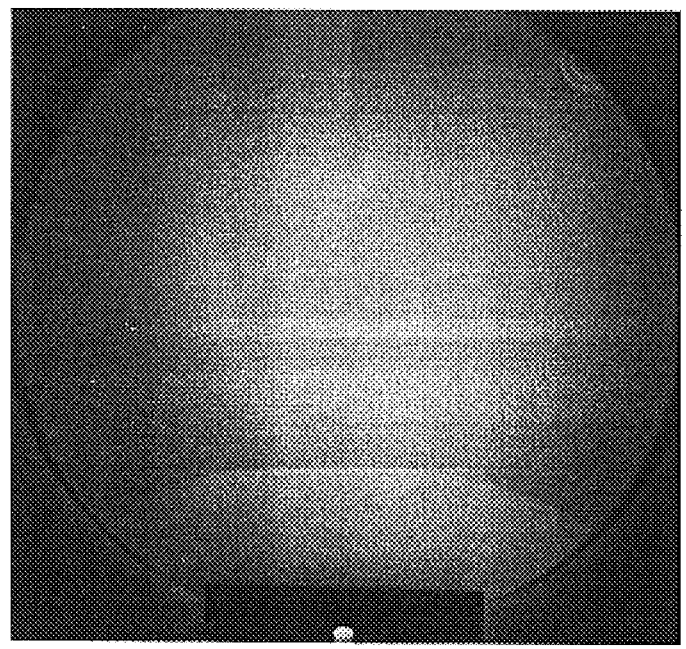

The SiGe wafer was then bonded to a thermally oxidized Si wafer 1108, with an oxide layer 1110 thickness of 200 nm. To ensure adequate bonding, a hydrophobic pre-bonding clean was performed on the wafers. The standard RCA clean cannot be employed for this purpose since the SC1 bath etches Ge and hence roughens the SiGe surface. Instead, a piranha clean (10 minutes) followed by a 50:1 HF dip (30 seconds) was used, which leaves the surface hydrophobic. Such a clean was found to lead to stronger bonding than hydrophilic cleans, after subsequent annealing at moderate temperatures. In addition, the wafers must also be bonded in an ultra-clean environment to ensure no intrinsic voids (as shown in the IR image in FIG. 12A) due to particles at the wafer interfaces.

The wafer pair was annealed for 2 hours at 800° C. in a nitrogen ambient. The moderate temperature ensures strong bonding, but is low enough to minimize the diffusion of Ge into the strained Si layer. In addition, the 2 hour anneal at this temperature allows the intrinsic hydrogen voids formed during initial annealing to diffuse. The resulting pair was found to be void free using infrared imaging, and the fracture surface energy deduced with the Maszara razor test technique (FIG. 13B) was 3.7 J/m$^2$ (which is similar to the surface fracture energy found for Si to oxide bonding), demonstrating that the bonding is indeed strong enough to undergo further material processing, without the risk of delamination.

After bonding the wafers, the pair was coated with nitride to protect the backside of the handle wafer during etching. The backside of the SiGe wafer was then ground as at 1112, removing approximately 450 $\mu$m, and a first etch as at 1114 was performed on the wafers to remove the remaining Si from the SiGe wafers. Any etch which attacks Si and not SiGe can be used (eg, KOH, TMAH). For example, a KOH mixture (30% KOH by weight in water) at 80° C., with an etching time of 2 hours can be employed to remove the backside Si from the SiGe wafer. KOH etches do not significantly attack relaxed $Si_{1-x}Ge_x$ with Ge compositions of roughly 20% or higher, and hence stop near the top of the grade in our buffers. Note here that unlike pure Si, or strained SiGe based structures, the relaxed SiGe layer provides a natural etch stop, thus alleviating the need for a pa stop layer. This flexibility of doping as an independent variable with respect to etch-stop capability is important in designing device layers for different applications. For example, p$^{++}$ layers are not desired in RF applications.

Figure 13:
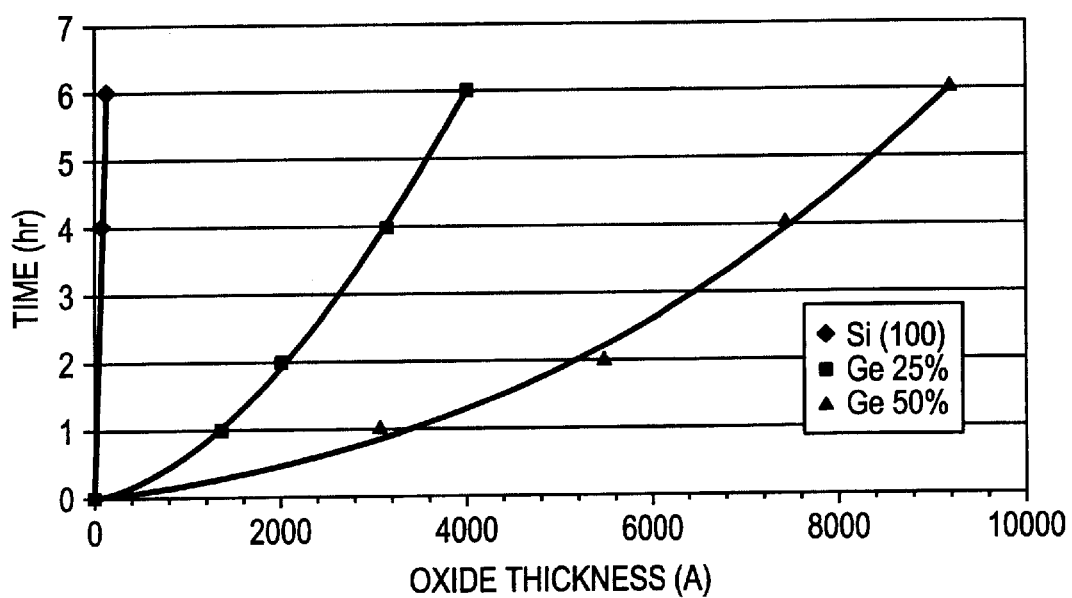
FIG. 13 is a graph of oxide thickness versus oxidation time, for 700° C. wet oxidation of SiGe alloys for various Ge concentration.

The next etch 1116 was employed to remove the remaining SiGe, and stop on the strained Si layer 1104. The active ingredient of this etch consists of any Ge oxidizing agent (eg, $H_2O_2$, $HNO_3$, low temperature wet oxidation), combined with an oxide stripping agent (eg, HF). For example, a low temperature (650° C.–750° C.) wet oxidation has been found to oxidize SiGe at much faster rates than Si, as shown in FIG. 13; for a 1 hour oxidation at 700° C., $Si_{0.75}Ge_{0.25}$ oxidizes at a rate of 2.5 nm/min, whereas Si has an oxidation rate of roughly 100 times smaller. In combination with a subsequent HF dip, the above oxidation can be used to remove very thin layers of SiGe, while stopping on Si.

Figure 14:
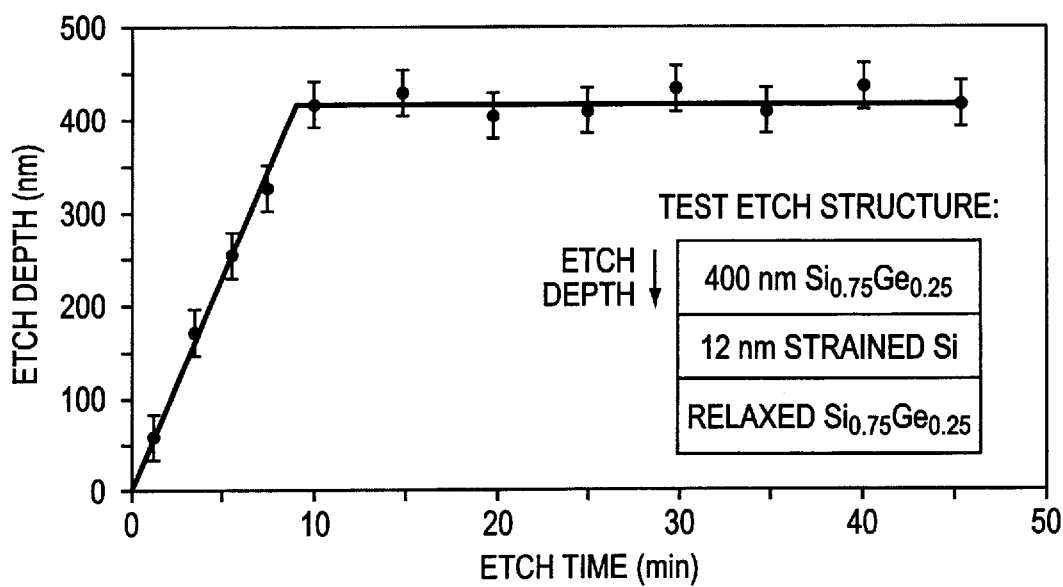
FIG. 14 is a graph showing the etching results using a HF:H$_2$O$_2$:CH$_3$COOH (1:2:3) solution, for the a test structure shown in inset diagram.

A chemical alternative to the above, is a solution of $HF:H_2O_2:CH_3COOH$ (1:2:3), with an etch time of approximately 30 minutes (in the case when the Si etch stops near the 20% Ge region). This has been shown to etch SiGe preferentially, with a very high selectivity; in particular, for relaxed $Si_{0.75}Ge_{0.25}$ versus Si, the selectivity is roughly 300. For demonstration purposes, a test sample consisting of 400 nm relaxed $Si_{0.75}Ge_{0.25}$ on 12 nm strained Si was partially masked and the etch depth versus time was measured using a profilometer. The results in FIG. 14 clearly show the high selectivity, in addition to the relatively fast etch rate of the $Si_{0.75}Ge_{0.25}$ surface layer. An important observation is that the solution was found to etch dislocation threads on the strained Si stop layer preferentially, causing pitting, which in turn lead to breeches in the strained Si layer when the etch time was prolonged.

Figure 15:
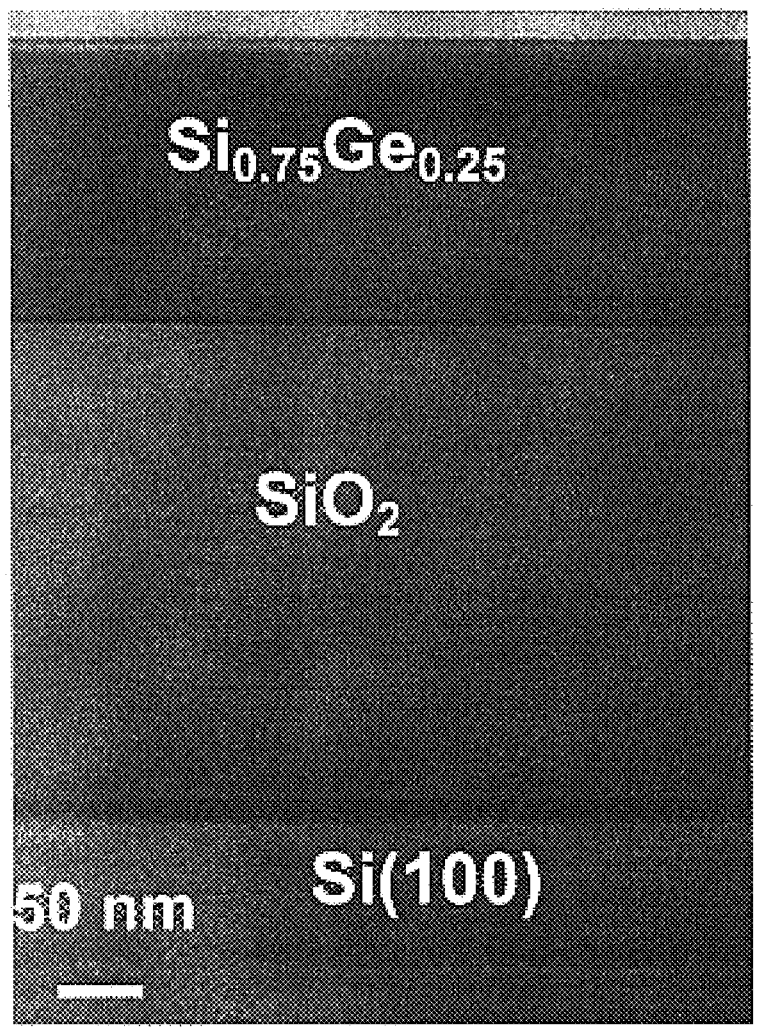
FIG. 15 is a cross-sectional TEM micrograph of a final exemplary SiGe on oxide structure.

FIG. 15 shows a TEM cross-sectional image of the SiGeOI structure fabricated using the proposed technique. No structural defects, such as threading dislocations, were observed in the cross-sectional TEM of the SiGe layer. A low density of threads in the 10$^5$ cm$^{-2}$ range was confirmed via EPD (etch pit density) of both the as-grown and bonded SiGe, which proves that there is no substantial increase in threading dislocations due to the proposed process. This is in contrast to SIMOX, which can possibly introduce many additional defects depending on the material system being implanted. In particular, the threading dislocation for implanted SiGe of various Ge fractions has not yet been reported in the literature.

Figure 16:
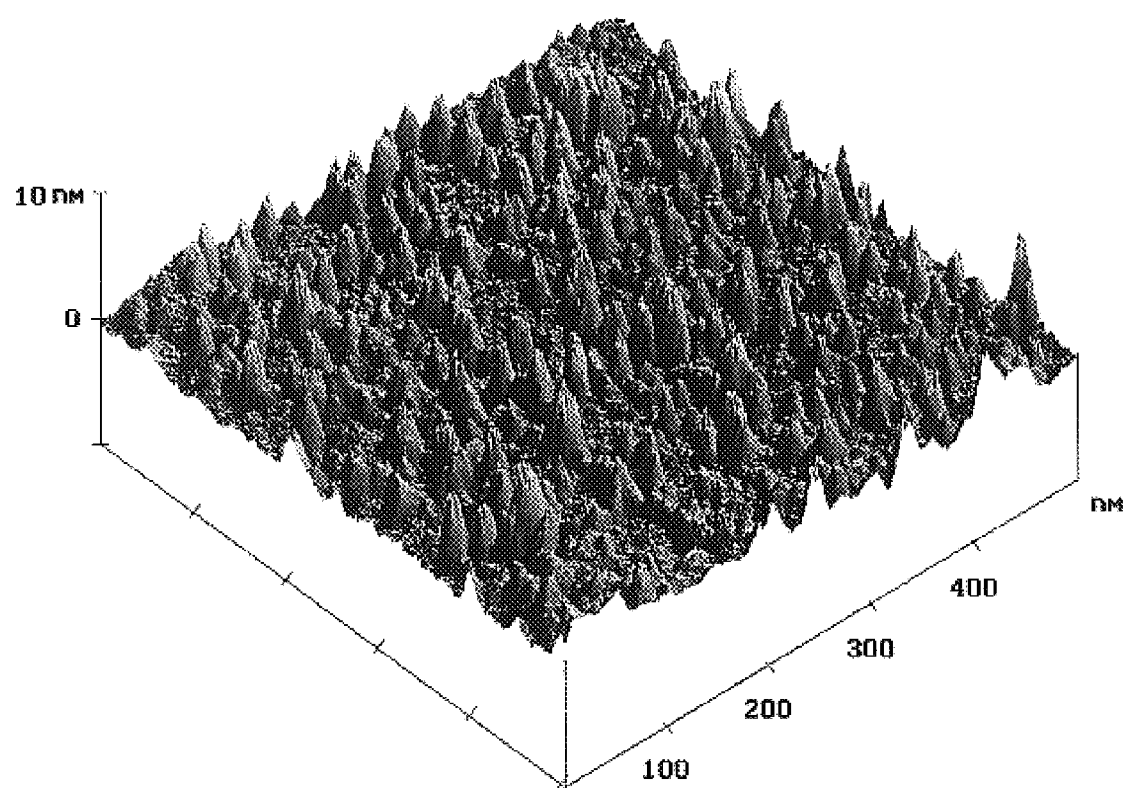
FIG. 16 is an atomic force microscope surface map of the remaining strained Si layer in the SiGeOI structure, after the 30 minute HF:H$_2$O$_2$:CH$_3$COOH (1:2:3) etch.

An AFM scan of the strained Si surface after the final etching, is shown in FIG. 16. The rms roughness was found to be roughly 1.0 nm, with a maximum peak-to-valley difference of 6.4 nm. This demonstrates that although the $HF:H_2O_2:CH_3COOH$ (1:2:3) SiGe etch, has a good selectivity, it leaves the strained Si layer moderately rough. Hence, when using this etch, the Si etch stop layer might not be smooth enough to double as a device channel, since the surface roughness may affect device performance. If this is so, the easiest and most general approach simply requires the removal of the Si etch stop layer with KOH, or any another Si etch that is selective to the Ge composition being used. The desired device structure can then be grown onto the SiGeOI substrate, including a strained Si surface channel or any other more elaborate structure.

An alternative approach, especially in the case of buried channel devices, would involve the incorporation of the device channel layers into the bonding structure. Either avenue is easily attainable using our flexible bonding/etch-back process. Using this general approach, the benefits of an insulating substrate (or for that matter, any substrate) can easily be applied to any SiGe device, without any constraints on SiGe thickness, Ge composition or insulating layer thickness or type.

Although the present invention has been shown and described with respect to several preferred embodiments thereof, various changes, omissions and additions to the form and detail thereof, may be made therein, without departing from the spirit and scope of the invention.

What is claimed is:

1. A monocrystalline etch-stop layer system for use on a monocrystalline Si substrate, said system comprising a substantially relaxed graded layer of $Si_{1-x}Ge_x$, and a uniform etch-stop layer of substantially relaxed $Si_{1-y}Ge_y$, wherein said uniform etch-stop layer of $Si_{1-y}Ge_y$ has a relative etch rate which is less than approximately the relative etch rate of Si doped with $7\times10^{19}$ boron atoms/cm$^3$.

2. The system of claim 1, wherein x<0.20.
3. The system of claim 1, wherein y>0.19.
4. The system of claim 1, wherein x<0.20 and y>0.19.
5. The system of claim 1, wherein said $Si_{1-y}Ge_y$ layer is bonded to a second substrate.
6. The system of claim 5, wherein said second substrate comprises Si.
7. The system of claim 5, wherein said second substrate comprises glass.
8. The system of claim 5, wherein said second substrate comprises quartz.
9. The system of claim 5, wherein said second substrate comprises a layer of $SiO_2$ on a second Si substrate.
10. The system of claim 5, wherein the first Si substrate and graded layer are substantially removed.
11. The system of claim 6, wherein the first Si substrate and graded layer are substantially removed.
12. The system of claim 7, wherein the first Si substrate and graded layer are substantially removed.
13. The system of claim 8, wherein the first Si substrate and graded layer are substantially removed.
14. The system of claim 9, wherein the first Si substrate and graded layer are substantially removed.
15. The system of claim 1, wherein a $SiO_2$ layer is deposited onto said $Si_{1-y}Ge_y$ layer.
16. The system of claim 15, wherein said $SiO_2$ layer is bonded to a second substrate.
17. The system of claim 16, wherein said second substrate comprises a layer of $SiO_2$ on a second Si substrate.
18. The system of claim 16, wherein said second substrate comprises a layer of $SiO_2$ on a glass substrate.
19. The system of claim 16, wherein said second substrate comprises a layer of $SiO_2$ on a quartz substrate.
20. The system of claim 16, wherein the first Si substrate and graded layer are substantially removed.
21. The system of claim 17, wherein the first Si substrate and graded layer are substantially removed.
22. The system of claim 18, wherein the first Si substrate and graded layer are substantially removed.
23. The system of claim 19, wherein the first Si substrate and graded layer are substantially removed.
24. The system of claim 10, wherein the surface is planarized.
25. The system of claim 11, wherein the surface is planarized.
26. The system of claim 12, wherein the surface is planarized.
27. The system of claim 13, wherein the surface is planarized.
28. The system of claim 14, wherein the surface is planarized.
29. The system of claim 20, wherein the surface is planarized.
30. The system of claim 21, wherein the surface is planarized.
31. The system of claim 22, wherein the surface is planarized.
32. The system of claim 23, wherein the surface is planarized.
33. A monocrystalline etch-stop layer system for use on a monocrystalline Si substrate, said system comprising a substantially relaxed graded layer of $Si_{1-x}Ge_x$; a uniform etch-stop layer of substantially relaxed $Si_{1-y}Ge_y$; and a strained $Si_{1-z}Ge_z$ layer, wherein said uniform etch-stop layer of $Si_{1-y}Ge_y$ has a relative etch rate which is less than approximately the relative etch rate of Si doped with $7\times10^{19}$ boron atoms/cm$^3$.
34. The system of claim 33, wherein z<y.
35. The system of claim 33, wherein y>0.18.
36. The system of claim 33, wherein y>0.18 and z<y.
37. The system of claim 33, wherein y>0.18 and z=0.
38. The system of claim 33, wherein said $Si_{1-z}Ge_z$ is bonded to a second substrate.
39. The system of claim 38, wherein said second substrate comprises Si.
40. The system of claim 38, wherein said second substrate comprises glass.
41. The system of claim 38, wherein said second substrate comprises quartz.
42. The system of claim 38, wherein said second substrate comprises a layer of $SiO_2$ on a second Si substrate.
43. The system of claim 38, wherein the first Si substrate and graded layer are substantially removed.
44. The system of claim 39, wherein the first Si substrate and graded layer are substantially removed.
45. The system of claim 40, wherein the first Si substrate and graded layer are substantially removed.
46. The system of claim 41, wherein the first Si substrate and graded layer are substantially removed.
47. The system of claim 42, wherein the first Si substrate and graded layer are substantially removed.
48. The structure in claim 33 in which a $SiO_2$ layer is deposited onto said $Si_{1-z}Ge_z$ layer.
49. The system of claim 48, wherein said $SiO_2$ layer is bonded to a second substrate.
50. The system of claim 49, wherein the second substrate comprises a layer of $SiO_2$ on a second Si substrate.
51. The system of claim 49, wherein said second substrate comprises a layer of $SiO_2$ on a glass substrate.
52. The system of claim 49, wherein said second substrate comprises a layer of $SiO_2$ on a quartz substrate.
53. The system of claim 49, wherein the first Si substrate and graded layer are substantially removed.
54. The system of claim 50, wherein the first Si substrate and graded layer are substantially removed.
55. The system of claim 51, wherein the first Si substrate and graded layer are substantially removed.
56. The system of claim 52, wherein the first Si substrate and graded layer are substantially removed.

57. A monocrystalline etch-stop layer system for use on a monocrystalline Si substrate, comprising a substantially relaxed graded layer of $Si_{1-x}Ge_x$; a uniform etch-stop layer of substantially relaxed $Si_{1-y}Ge_y$; a second etch-stop layer of strained $Si_{1-z}Ge_z$; and a substantially relaxed $Si_{1-w}Ge_w$ layer, wherein said uniform etch-stop layer of $Si_{1-y}Ge_y$ has a relative etch rate which is less than approximately the relative etch rate of Si doped with $7\times10^{19}$ boron atoms/cm$^3$.

58. The system of claim 57, wherein y−0.05<w<y+0.05.

59. The system of claim 57, wherein w=y.

60. The system of claim 57, wherein said $Si_{1-w}Ge_w$ is bonded to a second substrate.

61. The system of claim 60, wherein said second substrate comprises Si.

62. The system of claim 60, wherein said second substrate comprises glass.

63. The system of claim 60, wherein said second substrate comprises quartz.

64. The system of claim 60, wherein said second substrate comprises a layer of $SiO_2$ on a second Si substrate.

65. The system of claim 60, wherein the first Si substrate and graded layer are substantially removed.

66. The system of claim 61, wherein the first Si substrate and graded layer are substantially removed.

67. The system of claim 62, wherein the first Si substrate and graded layer are substantially removed.

68. The system of claim 63, wherein the first Si substrate and graded layer are substantially removed.

69. The system of claim 64, wherein the first Si substrate and graded layer are substantially removed.

70. The system of claim 57, wherein a $SiO_2$ layer is deposited onto said $Si_{1-w}Ge_w$ layer.

71. The system of claim 70, wherein said $SiO_2$ layer is bonded to a second substrate.

72. The system of claim 70, wherein the second substrate comprises a layer of $SiO_2$ on a second Si substrate.

73. The system of claim 70, wherein the second substrate comprises a layer of $SiO_2$ on a glass substrate.

74. The system of claim 70, wherein the second substrate comprises a layer of $SiO_2$ on a quartz substrate.

75. The system of claim 70, wherein the first Si substrate and graded layer are substantially removed.

76. The system of claim 71, wherein the first Si substrate and graded layer are substantially removed.

77. The system of claim 72, wherein the first Si substrate and graded layer are substantially removed.

78. The system of claim 73, wherein the first Si substrate and graded layer are substantially removed.

79. The system of claim 74, wherein the first Si substrate and graded layer are substantially removed.

80. A method of integrating a device or layer comprising:
depositing a substantially relaxed graded layer of $Si_{1-x}Ge_x$ on a Si substrate;
depositing a uniform etch-stop layer of substantially relaxed $Si_{1-y}Ge_y$ on said graded buffer; and
etching portions of said substrate and said graded buffer in order to release said etch-stop layer, wherein
said uniform etch-stop layer of $Si_{1-y}Ge_y$ has a relative etch rate which is less than approximately the relative etch rate of Si doped with $7\times10^{19}$ boron atoms/cm$^3$.

81. The method of claim 80, wherein x<0.20.

82. The method of claim 80, wherein y>0.19.

83. The method of claim 80, wherein x<0.20 and y>0.19.

84. The method of claim 80, wherein the etchant used to release the etch-stop layer is KOH.

85. The method of claim 80, wherein the etchant used to release the etch-stop layer is TMAH.

86. The method of claim 80, wherein the etchant used to release the etch-stop layer is EDP.

87. The method of claim 80, wherein the etch-stop is released and the etch-stop layer is planarized.

88. The method of claim 87, wherein the method of planarization is chemical-mechanical polishing (CMP).

89. A method of integrating a device or layer comprising:
depositing a substantially relaxed graded layer of $Si_{1-x}Ge_x$ on a Si substrate;
depositing a uniform first etch-stop layer of substantially relaxed $Si_{1-y}Ge_y$ on said graded buffer;
depositing a second etch-stop layer of strained $Si_{1-z}Ge_z$;
depositing a substantially relaxed $Si_{1-w}Ge_w$ layer;
etching portions of said substrate and said graded buffer in order to release said first etch-stop layer, and
etching portions of said residual graded buffer in order to release the second etch-stop $Si_{1-z}Ge_z$ layer, wherein
said uniform etch-stop layer of $Si_{1-y}Ge_y$ has a relative etch rate which is less than approximately the relative etch rate of Si doped with $7\times10^{19}$ boron atoms/cm$^3$.

90. The method of claim 89, wherein the etchant used to release the second etch-stop layer comprises an oxidant and an oxide stripping agent.

91. The method of claim 90, wherein the oxidant oxidizes Ge much more rapidly than Si.

92. The method of claim 90, wherein the oxidant comprises $H_2O_2$.

93. The method of claim 90, wherein the stripping agent comprises HF.

94. The method of claim 90, wherein the oxidant comprises $H_2O_2$ and the stripping agent comprises HF.

95. The method of claim 94, wherein the diluting agent comprises $CH_3COOH$.

96. The method of claim 95, wherein the ratio of chemicals in the etchant are (1:2:3) for ($HF:H_2O_2:CH_3COOH$).

97. The method of claim 89, wherein wet oxidation is used to selectively oxidize the $Si_{1-x}Ge_x$ and $Si_{1-y}Ge_y$, thereby acting as an etch-stop with respect to $Si_{1-z}Ge_z$.

98. The method of claim 97, wherein the wet oxidation temperature is <750 degrees Celsius.

99. The method of claim 97, wherein the oxidized layers are removed by an HF and water solution.

100. The method of claim 98, wherein the oxidized layers are removed by an HF solution.

101. The method of claim 90, wherein the $Si_{1-z}Ge_z$ layer is subsequently removed using a selective etchant with respect to the $Si_{1-w}Ge_w$ layer.

102. The method of claim 91, wherein the $Si_{1-z}Ge_z$ layer is subsequently removed using a selective etchant with respect to the $Si_{1-w}Ge_w$ layer.

103. The method of claim 92, wherein the $Si_{1-z}Ge_z$ layer is subsequently removed using a selective etchant with respect to the $Si_{1-w}Ge_w$ layer.

104. The method of claim 93, wherein the $Si_{1-z}Ge_z$ layer is subsequently removed using a selective etchant with respect to the $Si_{1-w}Ge_w$ layer.

105. The method of claim 94, wherein the $Si_{1-z}Ge_z$ layer is subsequently removed using a selective etchant with respect to the $Si_{1-w}Ge_w$ layer.

106. The method of claim 95, wherein the $Si_{1-z}Ge_z$ layer is subsequently removed using a selective etchant with respect to the $Si_{1-w}Ge_w$ layer.

107. The method of claim 96, wherein the $Si_{1-z}Ge_z$ layer is subsequently removed using a selective etchant with respect to the $Si_{1-w}Ge_w$ layer.

108. The method of claim 97, wherein the $Si_{1-z}Ge_z$ layer is subsequently removed using a selective etchant with respect to the $Si_{1-w}Ge_w$ layer.

109. The method of claim 98, Wherein the $Si_{1-z}Ge_z$ layer is subsequently removed using a selective etchant with respect to the $Si_{1-w}Ge_w$ layer.

110. The method of claim 99, wherein the $Si_{1-z}Ge_z$ layer is subsequently removed using a selective etchant with respect to the $Si_{1-w}Ge_w$ layer.

111. The method of claim 100, wherein the $Si_{1-z}Ge_z$ layer is subsequently removed using a selective etchant with respect to the $Si_{1-w}Ge_w$ layer.

* * * * *